United States Patent
Tokuyama et al.

(10) Patent No.: US 9,000,553 B2
(45) Date of Patent: Apr. 7, 2015

(54) POWER MODULE AND POWER CONVERTER CONTAINING POWER MODULE

(75) Inventors: Takeshi Tokuyama, Hitachi (JP); Kinya Nakatsu, Hitachinaka (JP); Toshiya Satoh, Hitachiota (JP); Hideaki Ishikawa, Mito (JP)

(73) Assignee: Hitachi Automotive Systems, Ltd., Hitachinaka-shi (JP)

( * ) Notice: Subject to any disclaimer, the term of this patent is extended or adjusted under 35 U.S.C. 154(b) by 234 days.

(21) Appl. No.: 13/638,394

(22) PCT Filed: Mar. 30, 2011

(86) PCT No.: PCT/JP2011/058096
§ 371 (c)(1),
(2), (4) Date: Nov. 16, 2012

(87) PCT Pub. No.: WO2011/125780
PCT Pub. Date: Oct. 13, 2011

(65) Prior Publication Data
US 2013/0062724 A1    Mar. 14, 2013

(30) Foreign Application Priority Data

Apr. 1, 2010    (JP) ................... 2010-084780

(51) Int. Cl.
*H01L 21/00*    (2006.01)
*H05K 7/14*    (2006.01)
(Continued)

(52) U.S. Cl.
CPC ............ *H05K 7/1432* (2013.01); *H01L 25/072* (2013.01); *H01L 25/18* (2013.01);
(Continued)

(58) Field of Classification Search
CPC .. H05K 7/1432; H05K 7/20927; H01L 24/33; H01L 25/072; H01L 2924/1305; H01L 2924/1306; H01L 2924/30107; H01L 2924/3025; H01L 23/492; H01L 2924/3011; H01L 2924/13055
USPC ............... 257/499, 722; 361/715; 307/9.1
See application file for complete search history.

(56) References Cited

U.S. PATENT DOCUMENTS 8,212,382 B2 *   7/2012  Nakatsu et al. ............ 307/9.1
2007/0096278 A1   5/2007  Nakatsu et al.
2009/0231811 A1   9/2009  Tokuyama et al.

FOREIGN PATENT DOCUMENTS

JP    2003-68967 A    3/2003
JP    2007-53295 A    3/2007
(Continued)

OTHER PUBLICATIONS

International Search Report with English translation dated Jul. 5, 2011 (four (4) pages).

*Primary Examiner* — Laura Menz
(74) *Attorney, Agent, or Firm* — Crowell & Moring LLP

(57) ABSTRACT

A power module includes a semiconductor chip, a first coupling conductor with one main surface coupled to one main surface of the semiconductor chip, a second coupling conductor with one main surface coupled to the other main surface of the semiconductor chip, a coupling terminal supplied with electrical power from the direct current power source, and resin material to seal the semiconductor chip, and in which the resin member has a protruding section that protrudes from the space where the first and second coupling conductors are formed opposite each other, and the coupling terminal is clamped on the protruding section, and at least one of the first or second coupling conductors is coupled to a coupling terminal by way of a metallic material that melts at a specified temperature.

13 Claims, 25 Drawing Sheets

(51) Int. Cl.
  *H01L 25/07*   (2006.01)
  *H01L 23/00*   (2006.01)
  *H05K 7/20*    (2006.01)
  *H01L 25/18*       (2006.01)
  *H02M 1/32*        (2007.01)
  *H02M 7/00*        (2006.01)
  *H01L 23/492*      (2006.01)

(52) U.S. Cl.
  CPC .............. *H02M 1/32* (2013.01); *H02M 7/003* (2013.01); *H01L 2924/0132* (2013.01); *H01L 24/33* (2013.01); *H05K 7/20927* (2013.01); *H01L 2224/32245* (2013.01); *H01L 2224/48227* (2013.01); *H01L 2224/48472* (2013.01); *H01L 2224/73265* (2013.01); *H01L 2924/014* (2013.01); *H01L 2924/13091* (2013.01); *H01L 2924/0133* (2013.01); *H01L 2224/29109* (2013.01); *H01L 2224/29111* (2013.01); *H01L 2924/01012* (2013.01); *H01L 2924/01029* (2013.01); *H01L 2224/48091* (2013.01); *H01L 2224/48247* (2013.01); *H01L 2224/291* (2013.01); *H01L 2924/13055* (2013.01); *H01L 2924/3011* (2013.01); *H01L 23/492* (2013.01); *H01L 2924/30107* (2013.01); *H01L 2924/3025* (2013.01); *H01L 2924/1306* (2013.01); *H01L 2924/1305* (2013.01)

(56) References Cited

FOREIGN PATENT DOCUMENTS

| | | |
|---|---|---|
| JP | 2008-235502 A | 10/2008 |
| JP | 2009-105178 A | 5/2009 |
| JP | 2009-219270 A | 9/2009 |

* cited by examiner

POWER MODULE AND POWER CONVERTER CONTAINING POWER MODULE

TECHNICAL FIELD

The present invention relates to a power module including internal semiconductor devices, and a power converter containing a power module.

BACKGROUND ART

In recent years, power converters must handle a large electrical current flow yet at the same meet demands for a small size. Attempting to pass a large electrical current flow through the power converter causes large heat emission from the semiconductor devices. Unless the heat capacity of the power converter is greatly improved, the semiconductor devices will reach a heat breakdown temperature due to their large heat emission but boosting the heat capacity prevents making the power converter smaller. Whereupon, a dual-sided cooling type power module was invented that improves the cooling efficiency by cooling the semiconductor element from both sides.

In this dual-sided cooling type power module, lead frames serving as sheet conductors enclose both main surfaces of the semiconductor device; and a cooling medium thermally couples and cools the side facing the main surface of the semiconductor device, and the lead frame surface on the opposite side.

The patent document 1 discloses an invention where a heat sink with protruding power leads is coupled to one main surface and to the other main surface of the power device, the power device and heat sink are sealed by a resin mold, and a fuse member is mounted between the terminal and the power lead protruding to outside the resin mold.

CITATION LIST

Patent Literature

Patent document 1: Japanese Unexamined Patent Application Publication No. 2003-68967

SUMMARY OF INVENTION

Technical Problem

However, one inverter contains a plurality of power modules, so improved reliability is further required when a fuse is mounted in each and every one of the power modules.

Solution to Problem

In a first aspect of the present invention, a power module includes a semiconductor chip; a first coupling conductor with one main surface coupled to one main surface of the semiconductor chip; a second coupling conductor with one main surface coupled to the other main surface of the semiconductor chip; a coupling terminal supplied with electrical power from the direct current power source; and resin material to seal the semiconductor chip; and in which the resin material has a protruding section that protrudes from the space where the first and second coupling conductors are formed opposite facing each other, and the coupling terminal is clamped over the protruding section, and at least one of the first or second coupling conductors is coupled to a coupling terminal by way of a metal material that melts at a specified temperature.

In a second aspect of the present invention, the power module according to the first aspect preferably includes; a cooler having a structure with a bottom including an open section and moreover including a first cooling surface and a second cooling surface opposite the applicable first cooling surface; and in which the other main surface on the first coupling conductor is mounted opposite the first cooling surface, and the other main surface on the second coupling conductor is mounted opposite the second cooling surface, the protruding section protrudes from the open section to outside of the cooler, and the metal material is mounted over the protruding section protruding from the open section.

In a third aspect of the present invention, the power module according to the second aspect preferably includes: a first insulation member mounted between the other main surface on the first coupling conductor, and the first cooling surface; and a second insulation member mounted between the other main surface on the second coupling conductor, and the second cooling surface.

In a fourth aspect of the present invention, a power module according to any one of the second or the third aspects, and in which the semiconductor chip is comprised of an IGBT, and moreover the one main surface of the IGBT includes a collector electrode, the other main surface of the IGBT includes an emitter electrode, the coupling terminal is comprised of a positive coupling terminal electrically coupled by way of the first coupling conductor to the collector electrode of the IGBT and a negative coupling terminal electrically coupled by way of the second coupling conductor to the emitter electrode on the IGBT, and the second coupling conductor is preferably coupled by way of the metal material to the negative coupling terminal.

In a fifth aspect of the present invention, the power converter includes a semiconductor chip; a sheet conductor coupled to the main surface of the semiconductor chip; a coupling terminal electrically coupled to the direct current power source; a power module including a resin material to seal the sheet conductor; and a flow passage forming piece including a flow passage for flow of the cooling medium; and in which the flow passage forming piece includes an open section coupling with the flow passage on the specified surface, and the power module is immersed from the open section within the flow passage, and the resin material includes a protruding section protruding from the open section, and the coupling terminal is clamped in the protruding section, and a portion of the sheet conductor is coupled to the coupling terminal by way of a metal material that melts at a specified temperature.

In a sixth aspect of the present invention, the power converter according to a fifth aspect includes: a first cooling surface and a second cooling surface opposite the applicable first cooling surface, and moreover includes a cooler with a bottom including an open section, and in which the power module is accommodated within the cooler, and the sheet conductor is comprised of a first sheet conductor mounted opposite one of the main surfaces of the semiconductor chip, and a second sheet conductor mounted opposite the other main surface of the semiconductor chip, and further the applicable first sheet conductor is preferably mounted by way of the first insulation member opposite the first cooling surface, and the applicable second sheet conductor is mounted by way of the second insulation member opposite the second cooling surface.

In a seventh aspect of the present invention, the power converter according to a sixth aspect includes a flange section on one surface of applicable cooler formed with an open section, and the surface of applicable flange section on the side opposite the surface where the open section of the flange section is formed is preferably clamped to the flow passage forming piece.

In an eighth aspect of the present invention, a power converter according to any one of the sixth or the seventh aspects includes a condenser cell and a condenser module including a condenser case to accommodate the applicable condenser cell, and in which the condenser case contains a flange section in which holes are formed, and the power module coupling terminals pass through holes in the condenser case, and preferably the metal material is mounted in a space where the flange sections of the condenser case and the flange sections of the cooler are formed facing opposite each other.

In an ninth aspect of the present invention, a power converter according to any one of the fifth through eighth aspects includes a driver circuit board to drive the semiconductor chip; and in which the tip of the coupling terminal extends in a direction away from the open section of the flow passage forming piece, and the main surface of the driver circuit board is opposite the open section, and further the applicable driver circuit board is preferably mounted above the edge of the coupling terminal.

In a tenth aspect of the present invention, a power converter according to any one of the fifth through eighth aspects includes a control circuit board to generate control signal for controlling the semiconductor chip, and a metal base to hold the control circuit board, and in which the metal base is preferably mounted between the flow passage forming piece and the control circuit board.

Advantageous Effects of the Invention

The present invention improves the reliability of the power module, and the power converter containing the power module.

DESCRIPTION OF EMBODIMENTS

The power converter 200 of the present embodiment can be utilized in hybrid cars and regular electric vehicles. The control configuration and circuit configuration when utilized in a hybrid car is described as a representative example while referring to FIG. 1 and FIG. 2.

Figure 1:
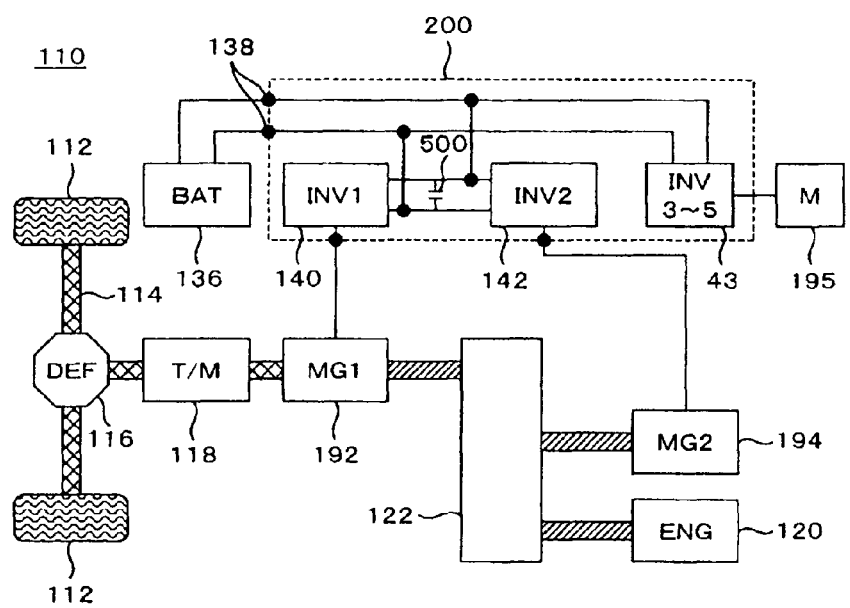
FIG. 1 is a control block diagram for the hybrid car of the present embodiment.

FIG. 1 is a drawing showing the control block diagram of the hybrid car.

The power converter of the present embodiment is described for the case of a vehicle drive inverter device utilized for a vehicle electric drive systems in extremely harsh installation and operating environments. The structure of the present embodiment is ideal as a power converter for driving vehicles such as cars and trucks. However the present embodiment may also be applied to other power converters such as power converters for trains, and ships, and aircraft and also in industrial power converters utilized as control devices for motors for driving the factory equipment, and household power converters utilized in control device for motors for driving electrical products and home solar power generating systems.

A hybrid electric vehicle (hereafter, described as "HEV") 110 is a single electric vehicle and may include two vehicle drive systems in FIG. 1. One drive system is the engine system serving as the drive power source with an engine 120 as an internal combustion engine. The engine system is utilized mainly as the drive source for the HEV. Another drive system is the vehicle-mounted (hereafter, "on-board") electrical system whose drive power source is the motor generators 192, 194. The on-board electrical system is utilized as the main power generating source for the HEV drive power source and the HEV power generating source. The motor generators 192, 194 are for example synchronous devices or induction devices, and can operate as a motor for driving the vehicle or as electrical generators according to the drive method and so are here referred to as motor-generators.

A front wheel axle 114 is axially supported on the front section of the chassis to allow rotation, and a pair of front wheels 112 is mounted on both ends of the front wheel axle 114. A rear wheel axle is axially supported on the rear section of the chassis to allow rotation, and a pair of rear wheels is mounted on both ends of the rear wheel axle (not shown in drawing). The HEV in the present embodiment employs the so-called front-wheel drive system but conversely, a rear-wheel drive system may also be employed. A front wheel side differential gear (hereafter, described as "front wheel DEF") 116 is coupled mechanically to in the center section of the front wheel axle 114. An output shaft for a transmission 118 is mounted on the input side of the front wheel DEF 116. The output side of the motor generator 192 is mechanically coupled to the input side of the transmission 118. The output side of the motor generator 194 and the output side of the engine 120 are mechanically coupled by way of a power distributor mechanism 122 to the input side of the motor generator 192.

The inverter units 140, 142 are electrically coupled by way of the direct current (DC) connector 138 to the battery 136. The battery 136 and the inverter units 140, 142 are capable of mutually transferring electrical power. The present embodiment includes a first motor-generator unit comprised of a motor generator 192 and an inverter unit 140; and a second motor-generator unit comprised of a motor generator 194 and an inverter unit 142 and respectively uses these motor-generator units according to the drive status. In this embodiment, the first motor-generator unit can be operated by power from the battery 136 to function as a motorized-unit to drive the vehicle by way of the propulsion from the motor generator 192. Further in this embodiment, the first motor-generator unit or the second motor-generator unit can be operated by the power of the engine 120 or the motive power from the vehicle wheels as an electrical generating unit to charge the battery 136.

The battery 136 can further be utilized as a power source for driving the auxiliary unit motor 195. Auxiliary unit motors may for example be motors to drive the air conditioner compressor or motors to drive hydraulic pumps for control functions. The battery 136 supplies direct current (DC) power to the inverter unit 43, and is converted to AC power by the inverter unit 43 and supplied to the motor 95. The inverter unit 43 possesses the same basic functions as the inverter units 140 and 142, and controls the alternating current phase and frequency and power supplied to the motor 195. The capacity of the motor 195 is smaller than the capacity of the motor generators 192 and 194, so that the maximum converted electrical power from the inverter unit 43 is smaller than the inverter units 140 and 142, but the circuit structure of the inverter unit 43 is basically the same as the inverter units 140 and 142. The power converter 200 includes a condenser module 500 for smoothing out the DC electrical current supplied to the inverter unit 142 and inverter unit 43.

Figure 2:
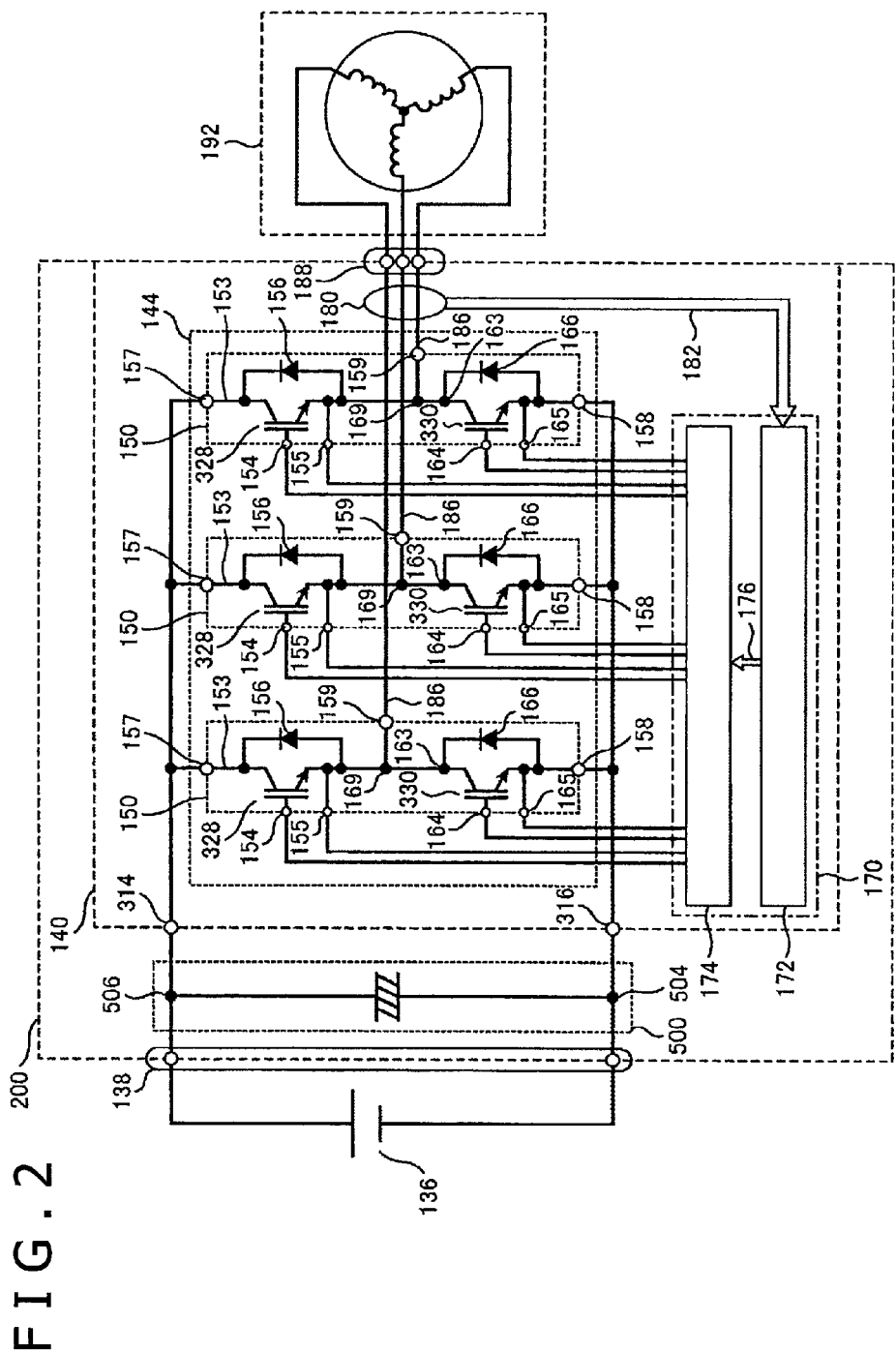
FIG. 2 is an electrical circuit structural diagram of the inverter unit of the present embodiment.

The electrical circuit structure of the inverter unit 140 and inverter unit 142 or the inverter unit 43 is described while referring to FIG. 2. In FIG. 2 the inverter unit 140 is utilized as a representative example.

The three (U phase, V phase, W phase) phase upper/lower arm series circuits 150 installed in the inverter circuit 144 correspond to each phase winding of armature winding in the motor generator circuit 192. The upper/lower arm series circuits 150 are comprised of an IGBT328 (insulation gate type bipolar transistor) and diode 156 operating as the upper arm, and an IGBT330 and the diode 166 operating as the lower arm. The respective upper/lower arm series circuits 150 are coupled from the center sections (intermediate electrodes 169) at the AC power line (AC bus-bar) 186 to the motor generator 192 by way of the AC terminal 159 and the AC connector 188.

The collector electrode 153 of the IGBT328 for the upper arm is electrically coupled to the positive side of the condenser electrode on the condenser module 500 by way of the positive terminal (P terminal). The emitter electrode of the IGBT330 for the lower arm is electrically coupled to the negative side of the condenser electrode on the condenser module 500 by way of the negative terminal (N terminal).

The regulator unit 170 is comprised of a driver circuit 174 to regulate the driving of the inverter circuit 144; and a regulator circuit 172 to supply control signals to the driver circuit 174 by way of the signal line 176. The IGBT328 and the IGBT330 operate by receiving drive signals output from the regulator unit 170 and the convert the direct current (DC) power supplied from the battery 136 into three-phase alternating current (AC). This converted electrical power is supplied to the armature winding of the motor generator 192.

The IGBT328 is comprised of a collector electrode 153, a signal emitter electrode 155, and a gate electrode 154. The IGBT330 is comprised of a collector electrode 163, a signal emitter electrode 165, and a gate electrode 164. The diode 156 is electrically coupled between the emitter electrode and the collector electrode 153. The diode 166 is electrically coupled between the emitter electrode and the collector electrode 163. A MOSFET (metal oxide silicon field effect transistor) may be utilized as the switching power semiconductor and in such cases the diode 156 and the diode 166 are not needed. The condenser module 500 is electrically coupled to the battery 136 by way of the positive condenser terminal 506 and the negative condenser terminal 504 and the direct current connector 138. The inverter unit 140 is coupled to the positive condenser terminal 506 by way of the direct current positive terminal 314, and also coupled to the negative condenser terminal 504 by way of the direct current negative terminal 316.

The regulator circuit 172 includes a microcomputer (hereafter described as "microcomputer") to calculate the switching timing of the IGBT328 and IGBT330. Target torque values required for the motor generator 192, electrical current values supplied from the upper/lower arm series circuit 150 to the armature winding of the motor generator 192, and magnetic position of the rotor for the motor generator 192 are input as input information to the microcomputer. The target torque value is based on the command signal output from an upstream control device not shown in the drawing. The electrical current value is detected based on the detection signal output by way of the signal line 182 from the electrical current sensor 180. The magnetic position is detected based on the detection signal output from the rotary magnetic pole sensor (not shown in drawing) mounted in the motor generator 192. In the present embodiment, the example described the detection of three-phase electrical current value but two-phase electrical current value may also be detected.

The microcomputer within the regulator circuit 172 calculates the d, q axis electrical current command values of the motor generator 192 based on the target torque value; and calculates the d, q axis voltage command values based on the differential between these calculated d, q axis electrical current command values and the detected d, q axis electrical current values; and converts these calculated d, q axis voltage command values to U phase, V phase, and W phase voltage command values based on the detected magnetic position. The microcomputer then generates pulse modulated waves by comparing the fundamental waves (sine waves) and carrier waves (triangular waves) based on the U phase, V phase, and W phase voltage command values, and outputs these generated modulation waves as PWM (pulse width modulation) signal by way of the signal line 176 to the driver circuit 174.

When driving the lower arm, the driver circuit 174 outputs a drive signal as the amplified PWM signal to the gate electrode of the IGBT 330 of the corresponding lower arm. When driving the upper arm, the driver circuit 174 amplifies the PWM signal after shifting the reference voltage potential level of the PWM signal to the upper arm reference voltage potential level, and outputs this signal as the drive signal to the respective gate electrodes of the IGBT 328 for the corresponding upper arm.

The regulator unit 170 detects abnormalities (such as excessive electrical currents, excessive voltages, excessive temperatures, etc.) to protect the upper/lower arm series circuits 150. Sensing information is therefore input to the regulator unit 170. Electrical current information flowing in the emitter electrode in each of IGBT 328 and IGBT 330 from each of the arm signal emitter electrodes T55 and the signal emitter electrodes 165 for example is input to the corresponding drive unit (IC). Each drive unit (IC) in this way carries out excessive electrical current detection, and stops the switching operation by the corresponding IGBT 328, IGBT 330 when excessive electrical current was detected in order to protect the corresponding IGBT 328 and IGBT 330. The temperature sensor (not shown in drawing) mounted in the upper/lower arm series circuits 150 inputs the temperature information from the upper/lower arm series circuits 150 into the microcomputer. Voltage information from the direct current (DC) positive side of the upper/lower arm series circuits 150 is also input to the microcomputer. The microcomputer performs excessive temperature detection and excessive voltage detection based on the information and stops the switching operation of all of the IGBT 328 and IGBT 330 when an excessive temperature or excessive voltage is detected.

Figure 3:
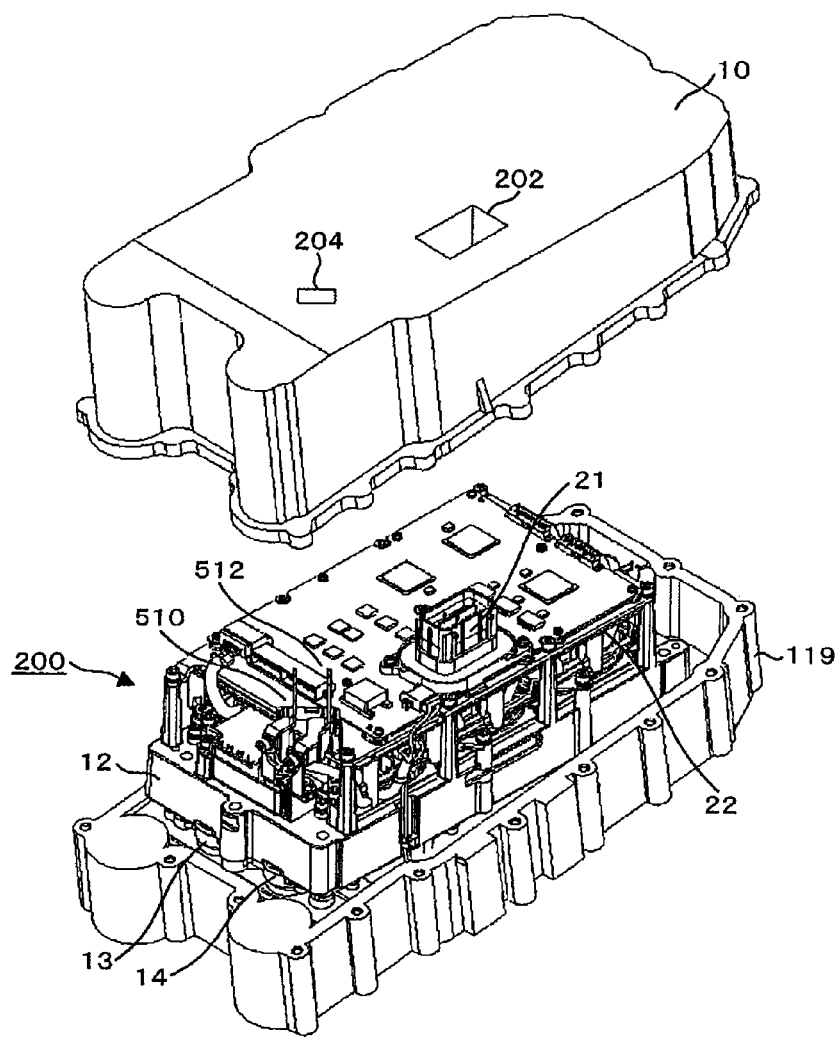
FIG. 3 is an exploded perspective view of the power converter of the present embodiment.

FIG. 3 is an exploded perspective view for describing the installation location of the power converter 200 of the present embodiment.

The power converter 200 of the present embodiment is clamped to the aluminum cabinet 119 for accommodating a transmission 118. The power converter 200 has a roughly rectangular shape on the bottom and top to allow easy installation into the vehicle make it easy to manufacture. Along with holding the condenser module 500 and the power module 300 described later on, the cooling jacket 12 cools by way of a cooling medium. The cooling jacket 12 moreover is clamped to the cabinet 119, and an inlet pipe 13 and an outlet pipe 14 are formed on the side opposite the cabinet 119. Coupling the inlet pipe 13 and the outlet pipe 14 to the pipes formed in the cabinet 119 allows the coolant medium to flow in and flow out from the cooling jacket 12 in order to cool the transmission 118.

The case 10 covers the power converter 200 and is also clamped to the cabinet 119. The bottom of the case 10 is structured so as to oppose the regulator circuit board 20 mounting the regulator circuit 172. A first opening 202 and a second opening 204 joining the bottom of the case 10 to the outside are formed on the bottom of the case 10. The connector 21 is coupled to the regulator circuit board 20 and transfers various types of signals from the outside to the applicable regulator circuit board 20. A battery negative side coupling terminal 510 and a battery positive side coupling terminal 512 are electrically coupled to the battery 136 and the condenser module 500.

The connector 21 and battery negative coupling terminal 510 and a battery positive coupling terminal 512 extend towards the bottom of the case 10. The connector 21 protrudes from the first opening 202, and moreover the battery negative coupling terminal 510 and a battery positive coupling terminal 512 protrude from the second opening 204. A sealing member (not shown in drawing) is mounted on periphery of the first opening 202 and the second opening 204 on the inner wall of the case 10.

How the mating surface of terminals such as the connector 21 face (orientation) may take various directions according to the vehicle model, however when mounted in particular in compact cars, the mating surface preferably faces upward in view of need for easy assembly and restrictions on the engine room size. In the present embodiment in particular in cases where the power converter 200 is mounted above the transmission 118, making the connector 21 protrude upward on the side opposite where the transmission 118 is mounted will improve workability. The connector 21 must moreover be sealed from the outside atmosphere. In this example of the embodiment, by installing the case 10 from above the connector 21, the sealing member contacting the case 10 can press on the connector 21 when the case 10 is mounted on the cabinet 119 so that the sealing is improved.

Figure 4:
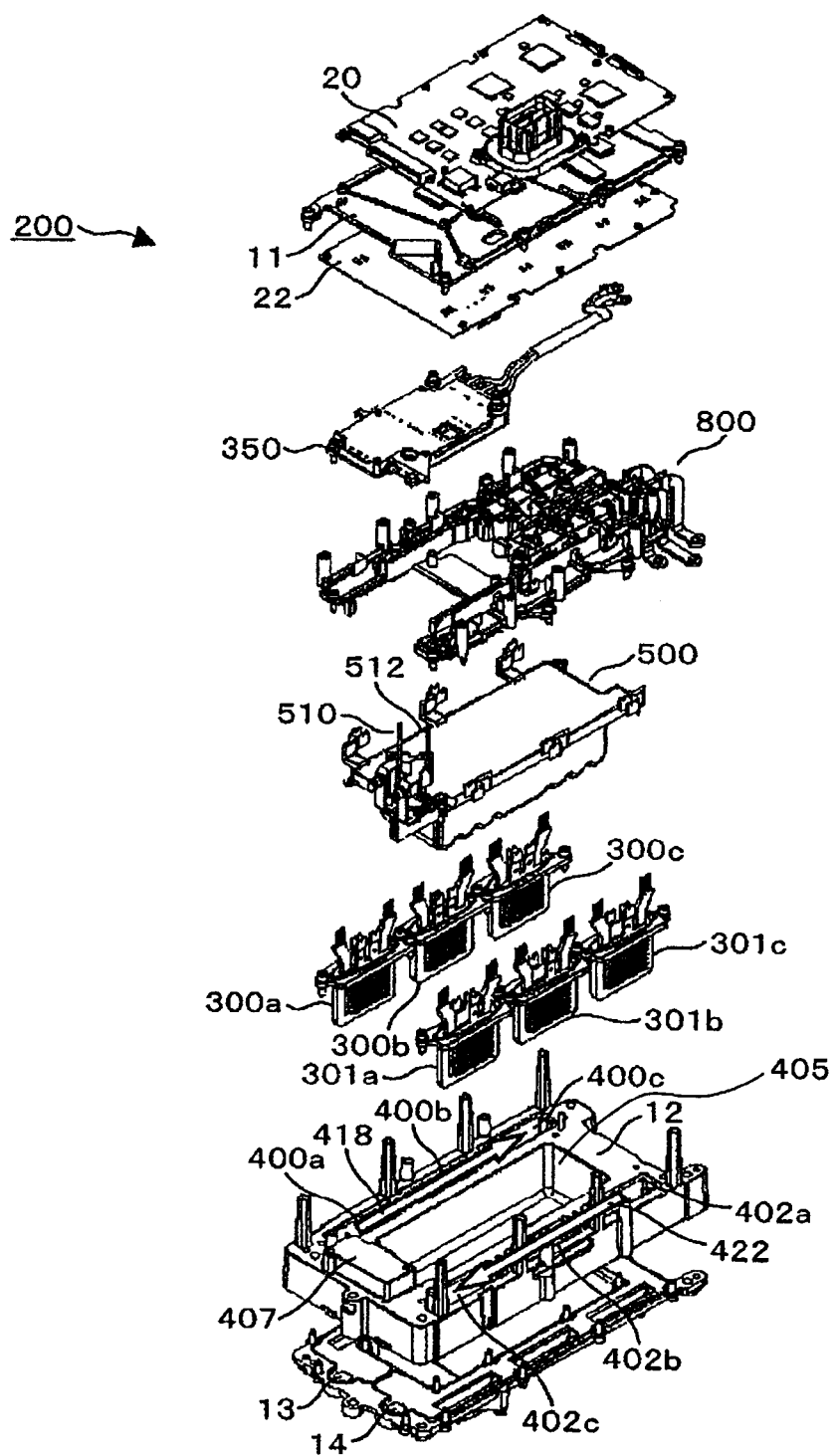
FIG. 4 is a detailed exploded perspective view of the power converter of the present embodiment.

FIG. 4 is a perspective view of the entire structure of the power converter of the present embodiment with each structural element exploded.

A flow passage 19 (FIG. 5) is formed in the cooling jacket 12. The openings 400a through 400c are formed along the coolant flow direction 418 on the upper surface of applicable flow passage 19, and moreover the openings 402a through 402c are formed along the coolant flow direction 422. The openings 402a through 402c are blocked by the power modules 301a through 301c and also the openings 400a through 400c are blocked by the power modules 300a through 300c.

A storage space 405 for accommodating the condenser module 500 is formed in the cooling jacket 12. Storing the condenser module 500 in the storage space 500 allows cooling it by the flow of coolant within the flow passage 19. The condenser module 500 can be satisfactorily and efficiently cooled since it is enclosed by the flow passage 19 that forms the coolant flow direction 418, and by the flow passage 19 that forms the coolant flow direction 422.

A protruding section 407 is formed in the cooling jacket 12 at a position opposite the inlet pipe 13 and the outlet pipe 14. The protruding section 407 is formed integrated into one piece with the cooling jacket 12. The auxiliary unit power module 350 is clamped to the protruding section 407 and is cooled by the flow of coolant within the flow passage 19. A bus bar module 800 is mounted on the side section of the auxiliary unit power module 350. The bus bar module 800 is comprised of an alternating current (AC) bus bar and a current sensor 180 and so on and is described in detail later on.

A storage space 405 for the condenser module 500 is in this way made in the center section of the cooling jacket 12, the flow passages 19 formed so as to enclose this storage space 405, the power modules 300a through 300c, and moreover the power modules 301a through 301c for vehicle drive are mounted in the respective flow passages 19, and further the auxiliary unit power module 350 is mounted on the upper surface of the cooling jacket 12. Cooling can therefore be efficiently performed in a small space, and the overall power converter made more compact. Moreover, integrating the main structure of the flow passage 19 for the cooling jacket 12 into a one-piece aluminum cast material renders the effect of boosting the mechanical strength of the flow passage 19 while also applying a cooling effect. Also, fabricating an aluminum cast structure integrates the cooling jacket 12 and flow passage 19 into one piece to achieve good heat conduction and boost the cooling efficiency.

The flow passage 19 is completed by clamping the power modules 300a through 300c and the power modules 301a through 301c to the flow passage 19 and a leak test of the passage is then performed. If the flow passage passes the leak test then the task of mounting the condenser module 500 and auxiliary unit power module 350 and boards can next be performed. The cooling jacket 12 is in this way mounted at the bottom of the power converter 200, and then the task of clamping the required part such as the condenser module 500, auxiliary unit power module 350, bus bar module 800, and boards can be sequentially performed from above to improve productivity and reliability.

The driver circuit board 22 is mounted above the auxiliary unit power module 350 and the bus bar module 800. A metal base plate 11 is mounted between the driver circuit board 22 and the control circuit board 20. The metal base plate 11 functions as a magnetic shield for circuits mounted in the driver circuit board 22 and the control circuit board 20 and also allows the heat emitted from the driver circuit board 22 and the control circuit board 20 to dissipate, and therefore renders a cooling effect.

Figure 5:
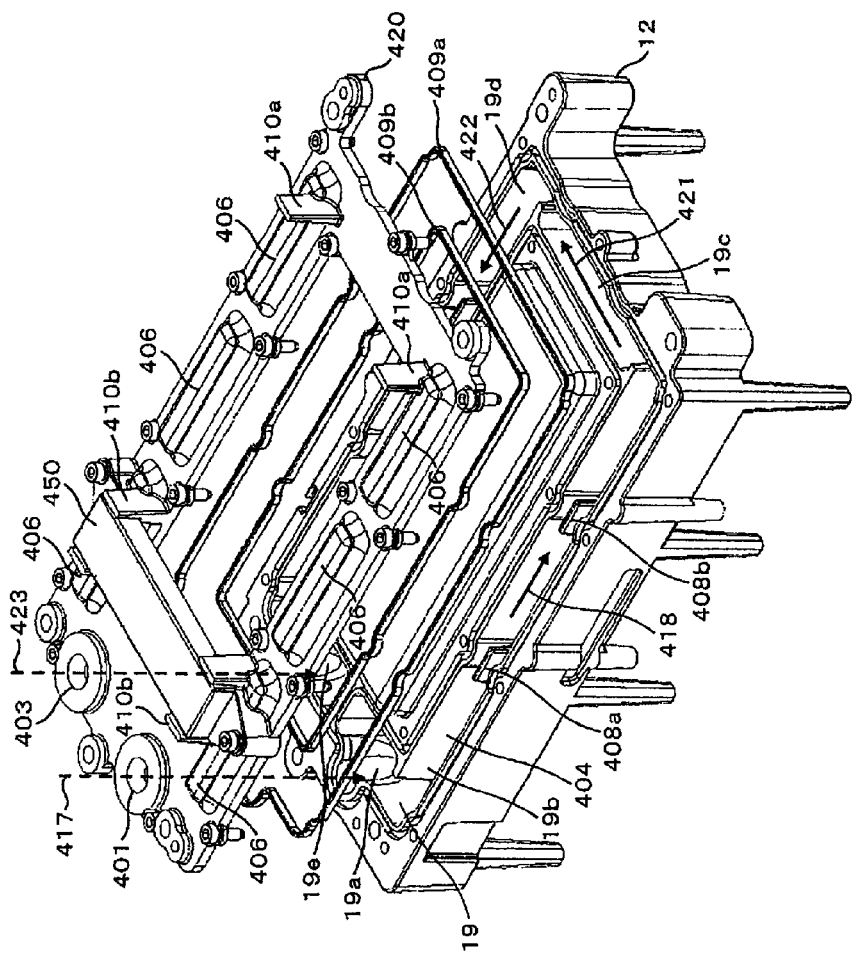
FIG. 5 is an exploded perspective view of the cooling jacket of the present embodiment.

FIG. 5 is a downward view of the cooling jacket 12 including the flow passage 19.

The cooling jacket 12 and the flow passage 19 mounted in the interior of the applicable cooling jacket 12 are cast into a single piece. An open section 404 configuring an opening is formed at the bottom side of the cooling jacket 12. The open section 404 is blocked by a lower cover 420 having an opening in the center section. A sealing member 409a and a sealing member 409b are mounted between the lower cover 420a and the cooling jacket 12 to maintain an air-tight state.

An inlet hole 401 for inserting an inlet pipe 13, and an outlet hole 403 for inserting an outlet pipe 14 along the applicable edge in the vicinity of one edge, are formed on the lower cover 420. A stud 406 is formed protruding towards the direction the transmission 118 is mounted. The stud 406 is mounted on each of the power modules 300a through 300c and the power modules 301a through 301c.

The coolant flows per the flow direction 417 in the inlet hole 401 and towards a first flow passage section 19a formed along the short side of the cooling jacket 12. The coolant then flows per the flow direction 19b along a second flow passage section 19b formed along the long side of the cooling jacket 12. Moreover, the coolant flows per the flow direction 421 along a third flow passage section 19c formed along the short side of the cooling jacket 12. The third flow passage section 19c is formed as a return path flow passage. The coolant moreover flows per the flow direction 422 along a fourth flow passage section 19d formed along the long side of the cooling jacket 12. The fourth flow passage section 19d is mounted at a position opposite the second flow passage 19b enclosing the condenser module 500. The coolant further flows per the flow direction 423 through the fifth flow passage section 19e and outlet hole 403 formed along the short side of the cooling jacket 12 and flows out to the outlet pipe 14.

The first flow passage section 19a, second flow passage section 19b, third flow passage section 19c, fourth flow passage section 19d and fifth flow passage section 19e are all formed along the large depth direction rather than the width direction. The power modules 300a through 300c are inserted (see FIG. 4) from the open sections 400a through 400c formed on the upper side of the cooling jacket 12, and accommodated in the storage space within the second flow passage section 19b. An intermediate member 408a to prevent stagnation of the coolant flow is formed between the storage space for the power module 300a and the storage space for the power module 300b. An intermediate member 408b is formed in the same way between the storage space for the power module 300b and the storage space for the power module 300c to prevent stagnation of the coolant flow. The intermediate member 408a and intermediate member 408b are formed so their main surface lies along the coolant flow direction. A storage space and intermediate member for the power modules 301a through 301c are formed in the same way for the fourth flow passage section 19d and the second flow passage section 19b. Moreover the cooling jacket 12 is formed opposite the open section 404 and open sections 400a through 400c and 402a through 402c to allow easily manufacturing an aluminum cast structure.

A support section 410a and support section 410b are mounted in contact with the cabinet 119 in the lower cover 420a in order to support the power converter 200. The support section 410a is mounted near one edge of the lower cover 420, and the support section 410b is mounted near the other edge of the lower cover 420. The power converter 200 can in this way be securely clamped on the side wall of the cabinet 119 formed to match the cylindrical shape of the motor generator 192 and the transmission 118.

The support section 410b is structured so as to support the resistor 450. This resistor 450 is for discharging the electrical charge accumulated in the condenser cell in view of safety aspects involved during maintenance and to protect the vehicle passengers. The resistor 450 is structured to continuously discharge high voltage, however even in the unlikely event that some type of abnormality occurred in the resistor or the discharge structure, a structure is required from the point of view of minimizing damage to the vehicle. Namely, if the resistor 450 is mounted in the vicinity of the power module or condenser module or driver circuit board and so on, then there is the possibility that fire might spread in the vicinity of major components in the unlikely case that the resistor 450 emits heat or sparks, etc.

Whereupon in the present embodiment, the power modules 300a through 300c or power modules 301a through 301c or condenser module 500 are mounted to enclose the cooling jacket 12, and mounted on the side opposite the cabinet 119 storing the transmission 118; なので and moreover the resistor 450 is mounted in the space between the cooling jacket 12 and the cabinet 119. The resistor 450 is in this way mounted in a closed space surrounded by the cabinet 119 and the cooling jacket 12 formed of metal. The switching operation by a switching scheme mounted on the driver circuit board 22 shown in FIG. 4 serves to control the discharge of the electrical charge accumulated in the condenser cell within the condenser module 500 to pass through the wiring alongside the cooling jacket 12 and discharge in the resistor 450. The switching scheme in this embodiment regulates the rapid discharge operation. The cooling jacket 12 is mounted between the driver circuit board 22 and the resistor 450 to control the discharge and so acts to protect the driver circuit board 22 from the resistor 450. Moreover, clamping the resistor 450 to the lower cover 420 mounts the resistor 450 extremely near thermally to the flow passage 19 so that abnormal heat emissions from the resistor 450 can be suppressed.

Figure 6:
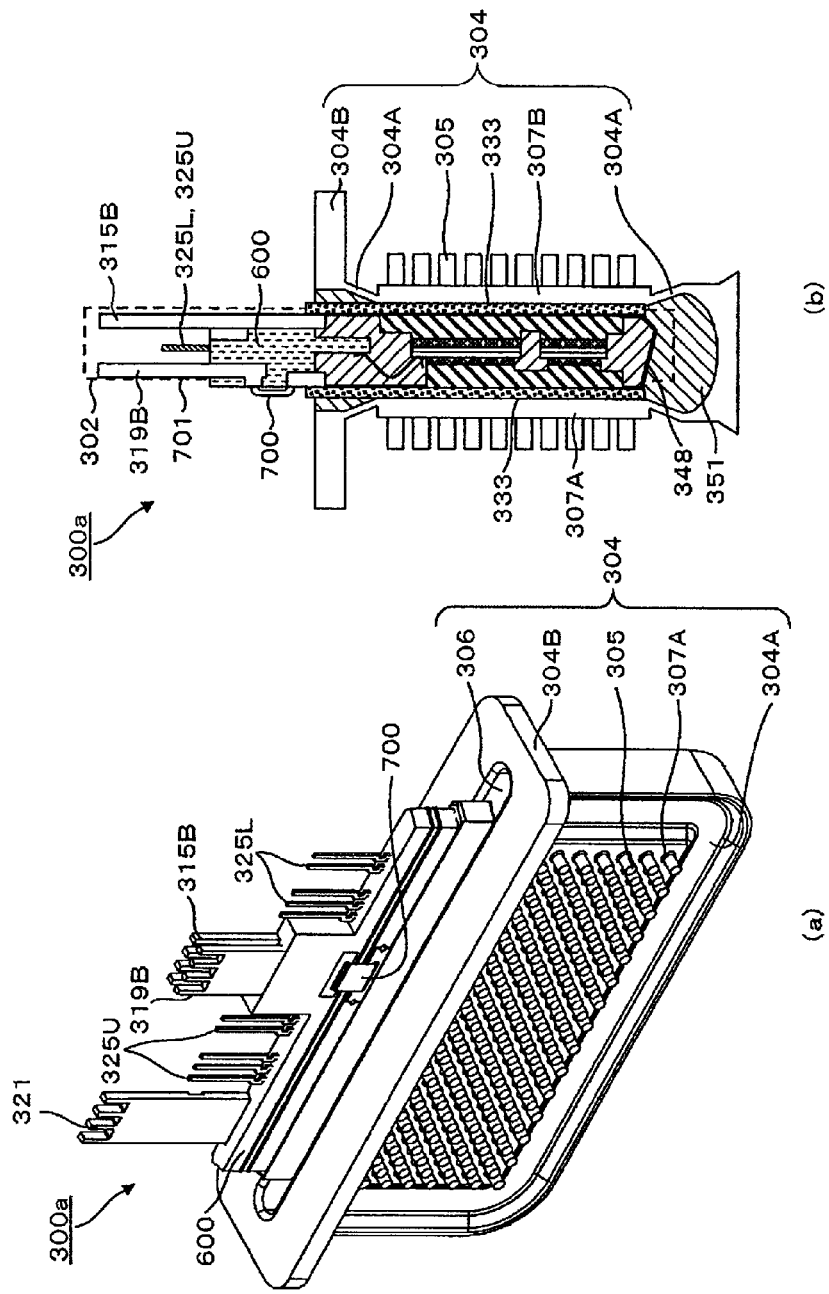
FIG. 6 is a perspective view and a cross sectional view of the power module of the present embodiment.

The detailed structure of the power module 300a utilized in the inverter unit 140 and the inverter unit 142 is described next while referring to FIG. 6 through FIG. 15. (a) in FIG. 6 is a perspective view of the power module 300a of the present embodiment. (b) of FIG. 6 is a cross sectional view of the power module 300a of the present embodiment.

Figure 7:
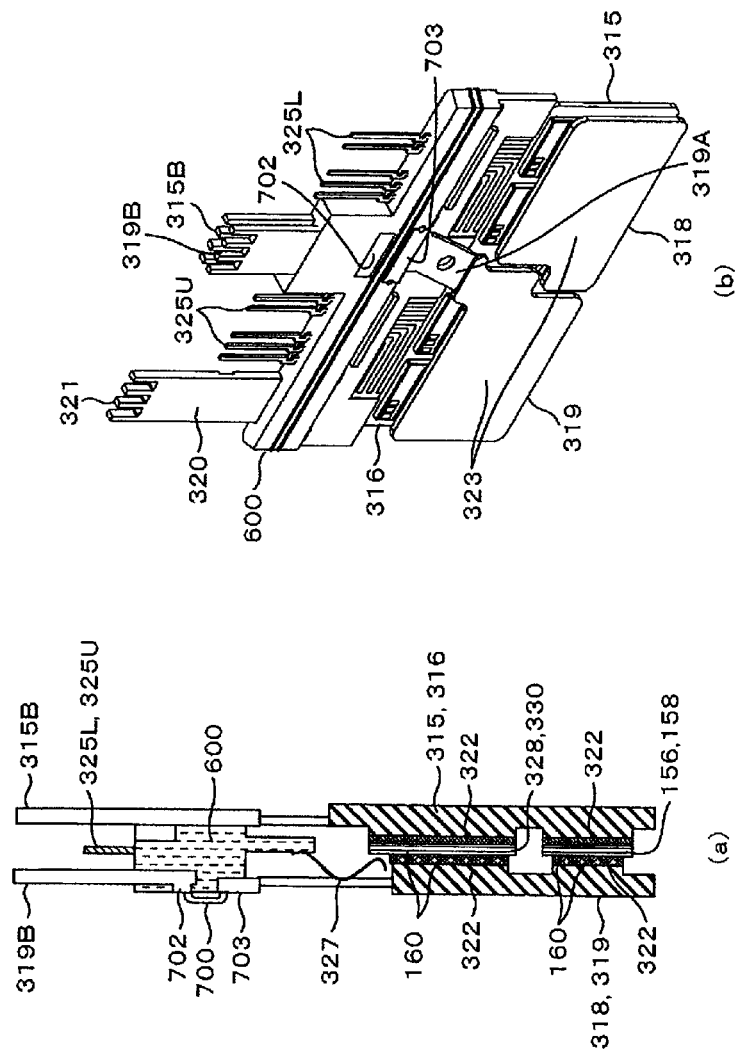
FIG. 7 is a cross sectional view and a perspective view of the interior of the power module of the present embodiment.
Figure 8:
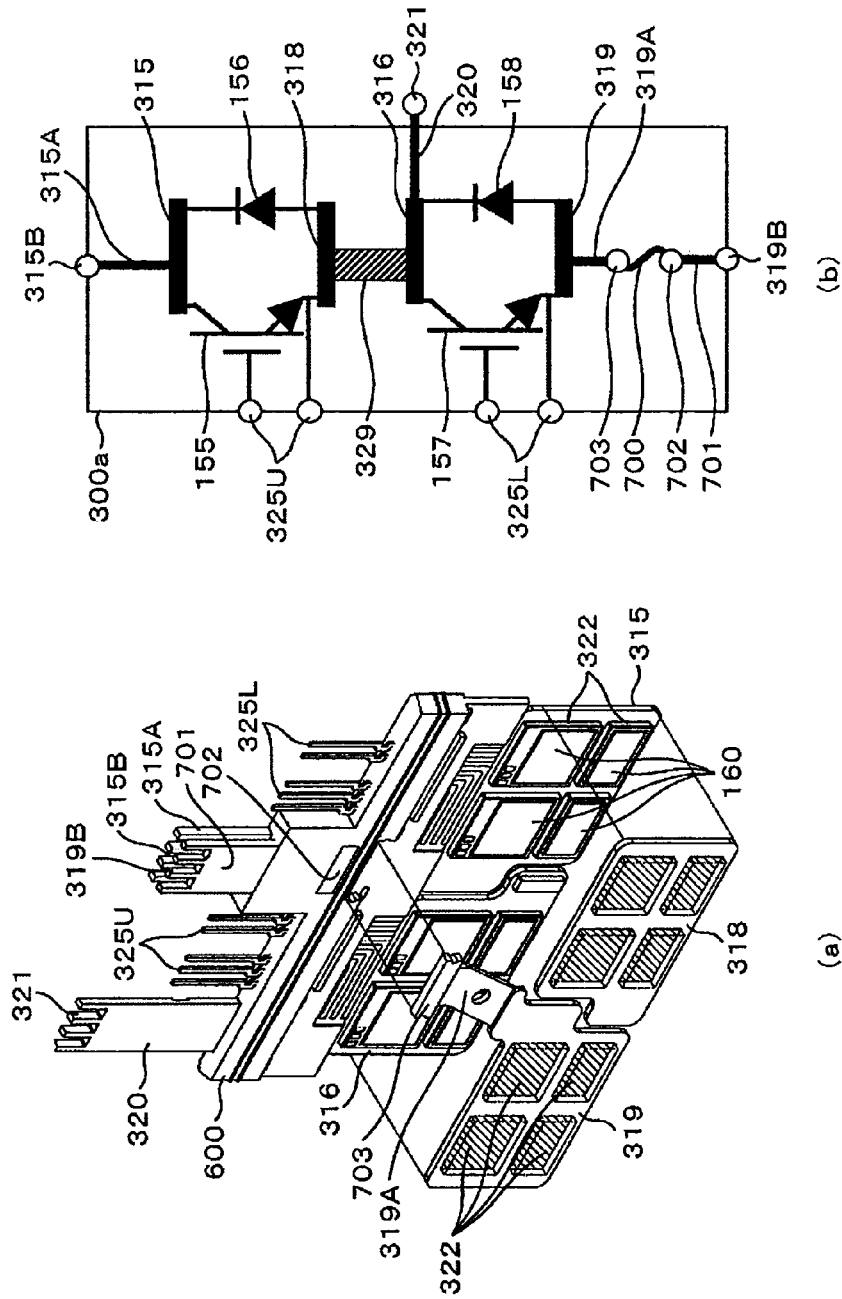
FIG. 8 is an exploded perspective view and a circuit diagram of the interior of the power module of the present embodiment.
Figure 9:
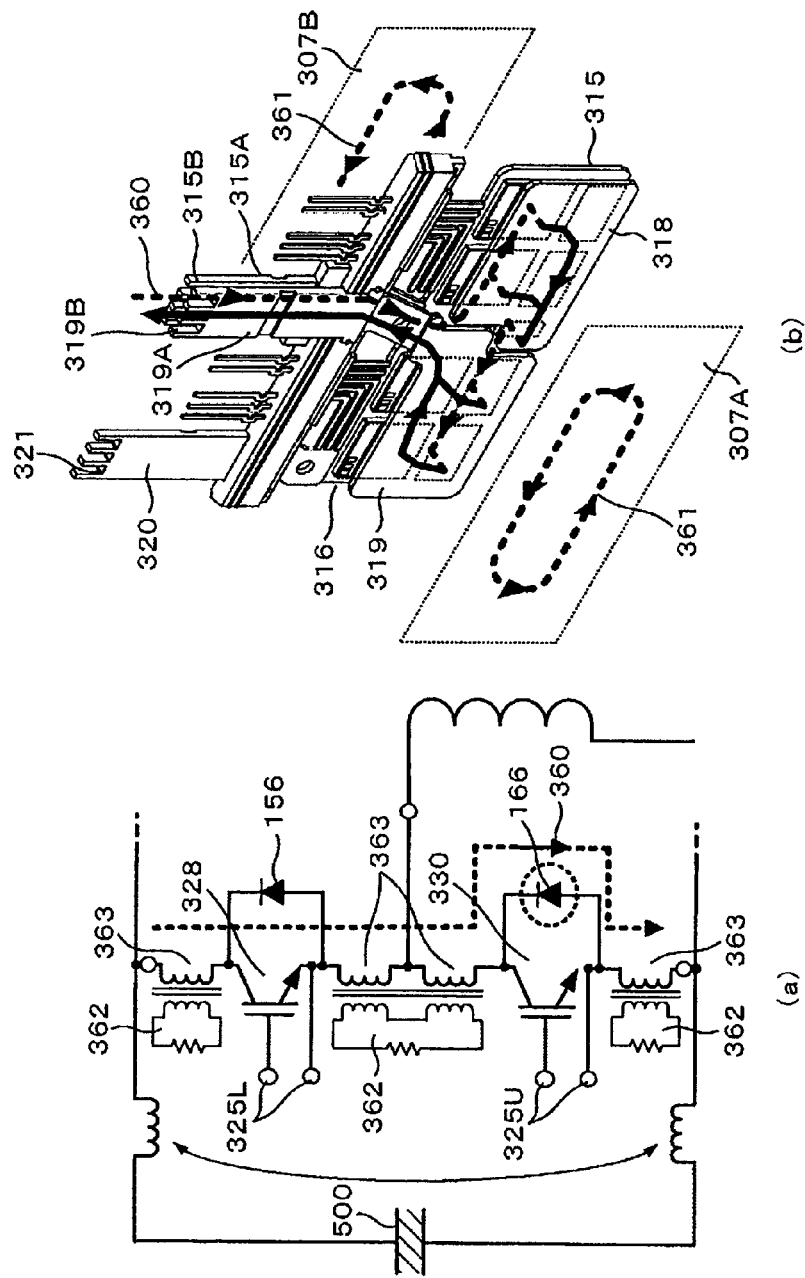
FIG. 9 is a drawing showing the electrical current flow passage when the recovery electrical current flowed in the power module of the present embodiment.

As shown in FIG. 7 through FIG. 9, the power semiconductor devices (IGBT328, IGBT330, diode 156, diode 166) contained in the upper/lower arm series circuit are clamped enclosed on both sides by the conduction plate 315 and conduction plate 318 or by the conduction plate 316 and conduction plate 319. An external signal terminal 325U and external signal terminal 325L serving as signal lines are built as a single integrated auxiliary mold piece 600 into these conduction plates. The conduction plates 315 and so on are sealed by a first sealer resin 348 in a state with their heat emission surface exposed and an insulation sheet 333 is thermo-compressed (or thermo-compression bonded) onto the applicable heat emission surface. The module primary sealing piece 302 sealed by the first sealer resin 348 encloses the insulation sheet 333 inserted into the module case 304 and is thermo-compressed to the inner surface of the module case 304 serving as the CAN cooler. The CAN cooler here is a cylindrical shaped refrigerator or cooler possessing an insertion slot 306 on one side, and a bottom on the other side.

The module case 304 is comprised of aluminum alloy material such as Al, AlSi, AlSiC, Al—C, and so on, formed into one seamless piece. The material used in the module case 304 is here specifically described as aluminum alloy material but copper and copper alloy material and so on may also be used. Utilizing copper material allows manufacturing the module case 304 at an inexpensive cost compared to aluminum alloy material. Other than the insertion slot 306, there is no opening in the module case 304 which is surrounded by the outer circumference of the flange 304B. Moreover, the first heat emission surface 307A and the second heat emission surface 307B possessing a surface wider than other surfaces are respectively mounted opposite each other as shown in (a) of FIG. 6, and the three surfaces joining the first heat emission surface 307A and the second heat emission surface 307B render a structure where the sealed surfaces are a narrower width than the applicable first heat emission surface 307A and the second heat emission surface 307B, and the insertion slot 306 forms the surface on the one remaining side. A fuse material 700 protruding from this insertion slot 306 is mounted in the vicinity of this auxiliary mold piece 600. Mounting this fuse material 700 allows preventing the destruction of the power module due to excessive electrical current. The module case 304 is inserted directly into the fluid passage from the inlets slots 400a, 400b, and 400c, and the external surface of the module case 304 is in direct contact with coolant medium. Mounting the fuse material 700 in the interior of the module case 304 might destroy the module case 304 when the fuse material 700 melts, and might further cause destruction of the overall device due to fluid leakage. Whereupon as in the present embodiment, the fuse material 700 is mounted in the auxiliary mold piece 600 protruding from the insertion slot 306. In this way, even if for example the fuse material 700 melts, the destruction of the module case 304 can be prevented and the reliability improved. The fuse material 700 moreover is mounted in the vicinity of the module case in direct contact with the coolant, and further coupled to the DC negative wire 319A and DC negative terminal 319B. One side of the DC negative wire 319A is coupled to the IGBT328, 330 and the diodes 156, 166, and the other side is attached by way of the first heat emission surface 307A and the resin insulation layer. In this structure the DC negative wire 319A, DC negative terminal 319B, and the semiconductor device are thermally coupled and so are each respectively cooled. The fuse material 700 coupled to the DC negative terminal 319A, DC negative terminal 319B is also cooled, to prevent emission of heat due to noise voltage from the fuse material 700 during normal operation, and therefore the melting of the fuse material 700 can be prevented during normal operation so that the reliability is improved. Moreover, even if there is an actual flow of excessive electrical current, the heat emission from the semiconductor device is conveyed by the above structure directly to the fuse material 700, and the temperature of the fuse material 700 is slaved to the temperature of the semiconductor device so that the fuse material 700 can definitely melt before the power module is destroyed. The reliability is therefore improved. The shape of the module case 304 need not be made a regular parallel piped and the corners may be curved as shown in (a) of FIG. 6.

Utilizing a metal case with this type of shape serves to maintain the coolant sealing by way of the flange 304B even if the module case 304 is inserted in the flow passage 19 where coolant such as water or oil flows so that penetration of the coolant medium into the interior sections of the module case 304 can easily be prevented. Forming a flange 304B on the circumference of the insertion slot 306 serves to prevent direct conduction of the heat emitted by the fuse material 700 to the sealing material 1000 and 1001 (displayed in FIG. 15) between the flow path passage forming piece and the flange 304B so that fluid leakage due to the dissolving of the sealing material 1000 and 1001 can be prevented and improves the reliability. Fins 305 are each uniformly formed at the opposite facing first heat emission surface 307A and the second heat emission surface 307B. Moreover, bent sections 304A are formed to be extremely thin at the outer circumference of the first heat emission surface 307A and the second heat emission surface 307B. The bent sections 304A easily deform by applying pressure on the fins 305 to the extent of becoming extremely thin and therefore boost productivity after the module primary sealing piece 302 has been inserted.

A second sealer resin 351 is filled into the empty space remaining in the interior section of the module case 304. Further, a DC positive wire 315A and the DC negative wire 319A are installed in order to electrically couple to the condenser module 500; and a DC positive terminal 315B and DC negative terminal 319B are formed at their (wires) tips of these wires as shown in FIG. 8 and FIG. 9. An alternating current (AC) wire 320 is mounted for supplying AC electrical power to the motor generator 192 or 194, and an AC terminal 321 is formed at the tip of the wire. In the present embodiment, the DC positive wire 315A is integrated with the conduction plate 315 as one piece and the alternating current (AC) wire 320 is integrated with conduction plate 316 as one piece; however the DC negative wire 319A is formed as a separate piece from the DC negative terminal 319B. The DC negative wire 319A side of the DC negative wire 319B is exposed from the auxiliary mold piece 600 to form the exposed section 702. Likewise, the DC negative terminal side of the DC negative wire 319A is exposed from the auxiliary mold piece 600, to form the exposed section 703. One end of the fuse material 700 is coupled to the exposed section 702, and the other end is coupled to the exposed section 703, and is coupled to the DC negative wire 319A and the DC negative terminal 319B. When welding the fuse material 700 to the exposed section 702 and exposed section 703 such as by ultrasonic welding, clamping the DC negative wire 319A and the DC negative terminal 319B to the auxiliary mold piece 600 allows welding without requiring a special clamping jig and therefore improves productivity. Further, the auxiliary mold piece 600 can sustain stress by serving as a foundation during welding of the fuse material 700 such as by ultrasonic welding so the fuse 700 can be attached and high reliability obtained.

As shown above, thermo-compressing for example the conduction plate 315 to the inner wall of the module case 304 by way of the insulation sheet 333 allows reducing the empty space between the conduction plate and the inner wall of the module case 304, and efficiently conveys the heat emitted from the power semiconductor device to the fins 305. Providing thickness and flexibility to a certain extent in the insulation sheet 333 allows thermal stress that occurs to be absorbed by the insulation sheet 333 to allow satisfactory usage in vehicle power converters that are subject to harsh temperature fluctuations.

(a) of FIG. 7 is an internal cross sectional view of the power module that the module case 304, the insulation sheet 333, the first sealer resin 348, and the second sealer resin 351 are removed in order to assist in understanding the embodiment. (b) of FIG. 7 is a perspective view of the internal section. (a) of FIG. 8 is an exploded view for assisting in understanding the structure in (b) of FIG. 7. (b) of FIG. 8 is a circuit diagram for the power module 300. (a) of FIG. 9 is a circuit diagram for describing the inductance reducing effect. (b) of FIG. 9 is a perspective view showing the flow of electrical current for describing the inductance lowering effect.

The placement of the power semiconductor device (IGBT 328, IGBT 330, diode 156, diode 166) and the conduction plate are described in relation to the electrical circuit shown in (b) of FIG. 8. As shown in (b) of FIG. 7, the conduction plate 315 for the DC positive side and the conduction plate 316 for the AC output side are positioned on approximately the same plane. The collector electrode of the IGBT 328 on the upper arm side and the cathode electrode of the diode 156 on the upper arm side are clamped to the conduction plate 315. The collector electrode of the IGBT 330 on the lower arm side and the cathode electrode of the diode 166 on the lower arm side are clamped to the conduction plate 316. The AC conduction plate 318 and the conduction plate 319 are positioned on approximately the same plane in the same way. The emitter electrode of the IGBT 328 on the upper arm side and the anode electrode of the diode 156 on the upper arm side are clamped to the AC conduction plate 318. The emitter electrode of the IGBT 330 on the lower arm side and the anode electrode of the diode 166 on the lower arm side are clamped to the conduction plate 319. Each of the power semiconductor devices is clamped respectively to the device clamp section 322 mounted on each conduction plate by way of the metal bonding material 160. The metal bonding material 160 for example is a low-temperature sintered bonding material containing for example solder material or silver sheet and tiny metal particles, etc.

Each power semiconductor device is a plate-shaped flat structure, and each electrode of the applicable power semiconductor devices is formed over the top and bottom surfaces. Each electrode of the power semiconductor devices as shown in (a) of FIG. 7 are enclosed by the conduction plate 315 and conduction plate 318 or the conduction plate 316 and conduction plate 319. The conduction plate 315 and conduction plate 318 are in other words, mounted as layers facing roughly in parallel opposite each other by way of the IGBT 328 and the diode 156. The conduction plate 316 and conduction plate 319 are in the same way mounted as layers facing roughly in parallel opposite each other by way of the IGBT 330 and the diode 166. The conduction plate 316 and the conduction plate 318 are coupled by way of an intermediate electrode 329. This coupling electrically joins the upper arm circuit to the lower arm circuit to form the upper/lower arm series circuit.

The DC positive wire 315A and the DC negative wire 319A are formed in a shape extending roughly in parallel opposite each other by way of the auxiliary mold piece 600 made of resin material. The external signal terminal 325U and external signal terminal 325L are integrated into a single piece in the auxiliary mold piece 600 and moreover extend facing in the same direction as the DC positive wire 315A and the DC negative wire 319A. Either thermosetting resin or thermoplastic resin possessing insulating properties are satisfactory as the resin material utilized in the auxiliary mold piece 600. Insulation can in this way be achieved between the DC positive wire 315A and the DC negative wire 319A and the external signal terminal 325U and external signal terminal 325L, and high density wiring also made possible. Moreover, mounting the DC positive wire 315A and the DC negative wire 319A opposite and roughly in parallel allows the electrical current that instantaneously flows during switching operation of the power semiconductor device to flow counter to each other and in opposite directions. The magnetic fields generated by the electrical current function to mutually cancel out each other and allow obtaining low impedance.

The effect causing low inductance is described while referring to (a) of FIG. 9. In (b) of FIG. 9 the fuse material 701 is omitted in order to make the electrical current flow easier to view.

(a) of FIG. 9 shows the state where the lower arm side diode 166 is conducting current biased in the forward direction. When the upper arm side IGBT 328 turns ON while in this state, the lower arm side diode 166 becomes biased in the reverse direction so that a recovery electrical current flows through the upper/lower arms due to carrier movement. A recovery current 360 as shown in (b) of FIG. 9 then flows at this time in each of the conduction plates 315, 316, 318, and 319. The recovery current 360 shown by the dotted lines, flows through DC positive terminal 315B mounted facing opposite the DC negative terminal 319B, and then flows in a loop-shaped flow path formed by each of the conduction plates 315, 316, 318, 319; and flows once again through the DC negative terminal 319B and the opposite mounted DC positive terminal 315B as shown by the solid line. The electrical current flowing through the loop-shaped flow path causes an eddy current 361 to flow in the first emission surface 307A and the second heat emission surface 307B of the module case 304. A magnetic field cancelling effect generated by an equivalent circuit 3162 along the current flow path of this eddy current 361 serves to lower the wiring impedance 363 in the loop-shaped flow path.

The closer the electrical current path of the recovery current 360 to a loop-shape, the larger the inductance reduction effect becomes. In the present embodiment, the current flow in the loop-shaped path as shown by the dotted line, flows along a path near the DC positive terminal 315B of conduction plate 315, and flows in the IGBT 328 and the diode 156. Then, in the loop-shaped current path as shown by the solid lines, the current flow along a path far from the DC positive terminal 315B side of conduction plate 318, and next flows as shown by the dotted lines, along a path far from the DC positive terminal 315B side of conduction plate 316, and flows into the IGBT 330 and the diode 166. Further, in the loop-shaped current path shown by the solid lines, the current flows along a path near the DC negative wire 319A side of conduction plate 319. In this type of loop-shaped flow path, the current flows along a path on the near side and far side of the DC positive terminal 315B and DC negative terminal 319B to form an electrical current path that is closer to a loop-shape.

Figure 10:
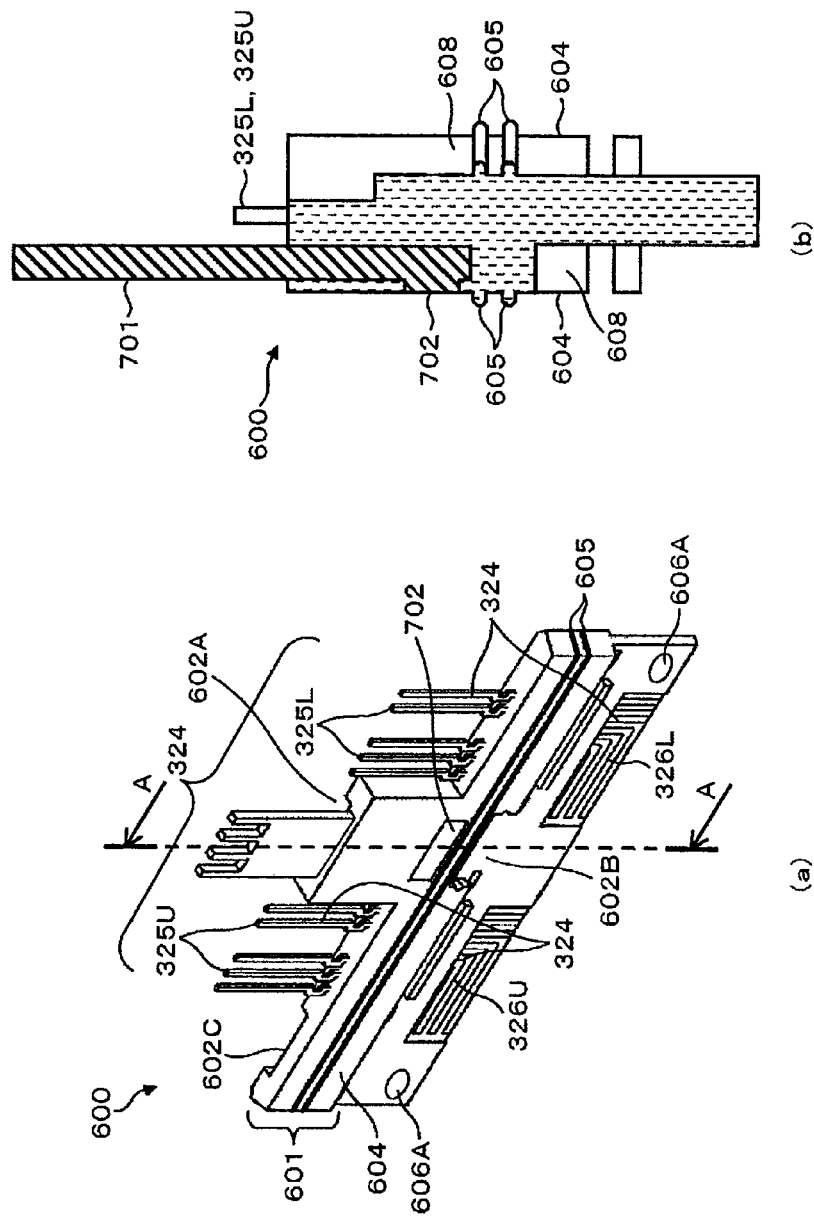
FIG. 10 is a perspective view of the auxiliary mold piece of the present embodiment, and a cross sectional view of the auxiliary mold piece cut along the lines A-A.

(a) of FIG. 10 is a perspective view of the auxiliary mold piece 600; and (b) of FIG. 10 is a cross-sectional view of the auxiliary mold piece cut along the lines A-A in (a) of FIG. 10.

The signal conductor 324 is integrated with the auxiliary mold piece 600 by way of an insert mold. The signal conductor 324 here includes an upper arm side gate electrode terminal 154 or emitter electrode terminal 155, and an upper arm side gate electrode terminal 164 or emitter electrode terminal 165 (Refer to FIG. 2); and further includes a terminal for conveying the power semiconductor device temperature information. In the description of the present embodiment, these terminals are generally called the external signal terminals 325U, 325L.

The signal conductor 324 includes the external signal terminals 325U and 325L on one end, and the device side signal terminals 326U and 326L on the other end. The device side signal terminals 326U and 326L are coupled to signal pads formed on the surface electrode of the power semiconductor device, and for example are coupled by wires. The sealer section 601 forms a shape extending across the longitudinal axis of the DC positive wire 315A and DC negative wire 319A, or the alternating current (AC) wire 320.

The auxiliary mold piece 600 is formed to a length that is longer than the total length of the horizontally arrayed conduction plates 315 and 316 or the total length of the horizontally arrayed conduction plates 319 and 320. In other words, the length of the horizontally arrayed conduction plates 315 and 316 or the horizontally arrayed conduction plates 319 and 320 is within the range of the auxiliarymoldpiece 600 length in the horizontal direction.

The sealer section 601 includes a wire fitting section 602B formed with a recess and for fitting the DC negative wire 319A in the applicable recess. The sealer section 601 also contains a wire fitting section 602A formed with a recess, and for fitting the DC positive wire 315A in the applicable recess. The sealer section 601 further contains a wire fitting section 602C positioned to the side of wire fitting section 602A and formed with a recess and for fitting the alternating current (AC) wire 320 into the applicable recess. Each wire portion can be set by fitting the respective wires into these wire fitting section 602A-602C. The task of filling the resin sealer material can in this way be performed after securely clamping these wires, and the productivity improved.

The sealer section 601 further includes a metal crimp surface 604 for making contact with the metal mold utilized during the resin sealing, and the metal crimp surface 604 is formed with a stud piece 605 formed one time around the longitudinal outer circumference of the sealer section 601 in order to prevent resin fluid leakage during the resin sealing. A plurality of stud pieces 605 are mounted for enhancing the resin leak prevention effect. Moreover, the stud pieces 605 are also mounted in the these wire fitting section 602A and wire fitting section 602B so that leakage of resin sealing material from the periphery of the DC positive wire 315A and DC negative wire 319A can be prevented. In view of the mounting in a metal mold at approximately 150 to 180° C., a thermosetting resin capable of withstanding high temperatures such as liquid crystal polymer or polybutylene terephthalate (PBT) or polyphenylene sulfide (resin) (PPS) is here preferable as a material for the sealer section 601 and the stud pieces 605.

A plurality of through holes 606A moreover is mounted in the longitudinal direction, on the power semiconductor device side of the short direction of the sealer section 601. An anchor effect is in this way achieved since the first sealer resin 348 flows into the through holes 606A and hardens, and the auxiliary mold piece 600 is securely attached in this first sealer resin 348. Therefore these will not peel (or separate) even if stress is applied due to temperature fluctuations or mechanical vibrations so that reliability is improved. Moreover peeling (or separation) will not occur even if an irregular (convex/concave) shape is utilized instead of the through holes. The above effect can be enhanced to a further extent by applying a polyimide coating to the sealer section 601 or by coarsening the surfaces.

In the process for sealing the module primary sealing piece 302 with the first sealer resin 348, the auxiliary mold piece 600 supporting each wire is first of all inserted into a metal mold heated to approximately 150 to 180° C. In this embodiment, the auxiliary mold piece 600, the DC positive wire 315A, the DC negative wire 319A, the alternating current (AC) wire 320, the conduction plate 315, the conduction plate 316, the conduction plate 318, and the conduction plate 319 are each securely connected so that mounting the auxiliary mold piece 600 in the specified position serves to mount the major circuits and the power semiconductor devices in their specified positions. Therefore, along with improving productivity, the reliability is also improved.

Figure 11:
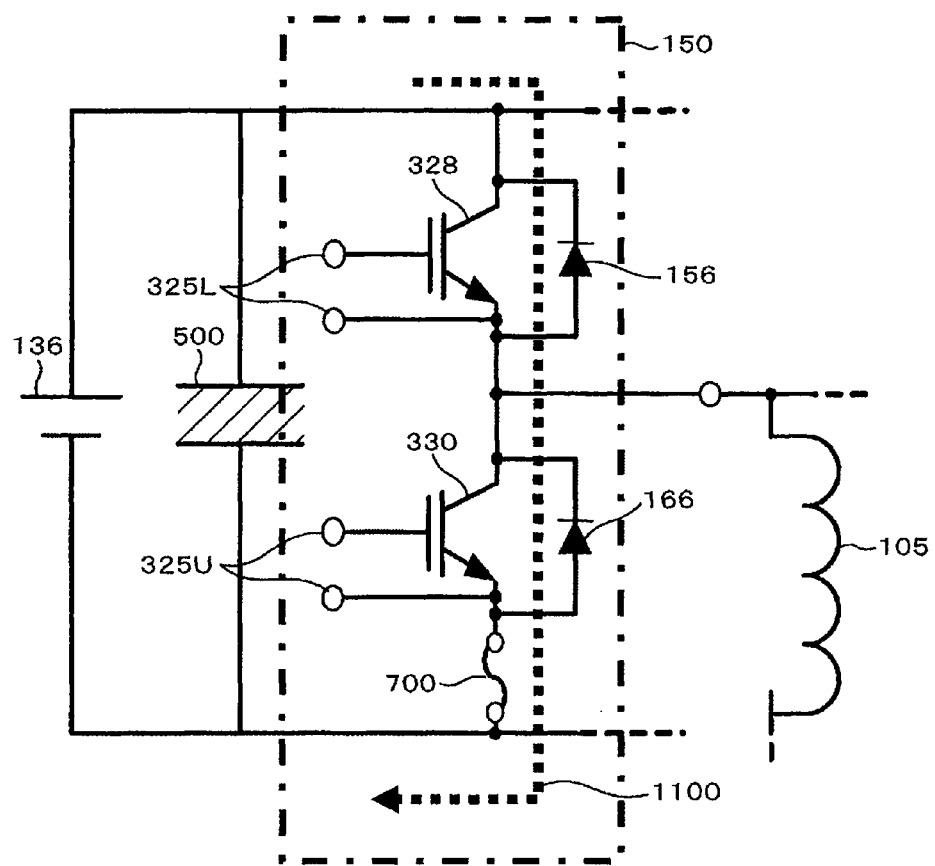
FIG. 11 is a circuit diagram showing the electrical current flow passage when excess electrical current flows in the power module of the present embodiment.

FIG. 11 is a circuit diagram showing the electrical current path when the excessive electrical current 1100 flowed in the circuit. In this way, even in the unlikely case that the direct current circuit 150 breaks down and excessive electrical current 1100 flows in the battery 136, the excessive electrical current can be cut off before the first sealer resin 348 melts or undergoes gas decomposition.

Figure 12:
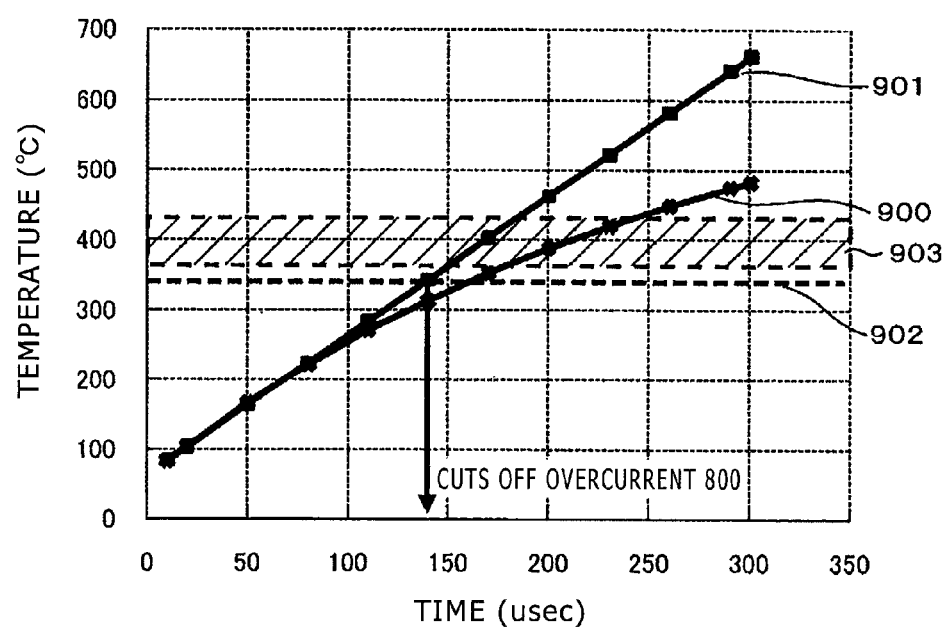
FIG. 12 is a graph describing the temperature characteristics of the fuse material of the present embodiment.

The temperature characteristics of the fuse material 700 are described in detail next while referring to FIG. 12. The horizontal axis in FIG. 12 is the time that the excess electrical current flowed in the circuit, and the vertical axis is the temperature at the time that the excess electrical current flowed. Here, 900 denotes the sealer resin temperature and 901 denotes the fuse material temperature. The excessive electrical current 1100 when the IGBT upper/lower arms are shorted is a large electrical current of 7000 to 10000 A. The shorting protection function for the driver circuit 174 shuts off the excessive electrical current 1100 within a short time of approximately 10 μsec. However in the unlikely event the shorting protection function has no effect then the sealer resin temperature 900 in the vicinity of the IGBT chip will rise between 200 to 300° C. in 100 μsec. The temperature of the fuse material 700 also rises proportionally at this time, rising at the same speed as the sealer resin temperature 900 in the vicinity of the IGBT chip or even faster. Major destruction of the sealed type power module might possibly occur due to gas accumulating internally in the module case by gas decomposition in the first sealer resin 348 by overheating. Whereupon, setting the fuse melting temperature 902 to the same or a lower temperature than the gas decomposition starting temperature 903 of the sealing resin will allow reliably shutting off the excessive electrical current 1100 by holding the internal gas to a minimum. The gas decomposition starting temperature 903 of the sealing resin is set from about 300° C. to 350° C. or higher in case of incombustible material. As described above, in view of functional aspects such during the transfer mold process, the auxiliary mold piece 600 and the sealer section 601 are preferably a thermoplastic resin that is resistant to heat such as polybutylene terephthalate (PBT) or polyphenylene sulfide (PPS). The gas decomposition temperature of these materials is often higher than the above described sealing resin gas decomposition starting temperature 903, and ranked in sequence from 340 to 500° C. By definitely making the above described fuse melting temperature 902 lower than the gas decomposition temperature of the auxiliary mold piece 600, a sequence leading to major destruction due to insulation breakdown between the DC positive conduction plate 315 and the DC negative conduction plate 319 can be prevented.

Figure 13:
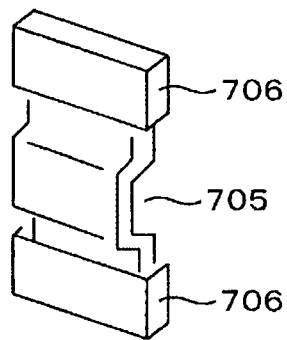
FIG. 13 is a drawing showing an example of the shape of the fuse material in the present embodiment.

The material for the fuse material 700 may include aluminum alloy (Al—Si type and Al—Si—Mg), Sn alloy (Sn—Cu type, Sn—Zn type, Sn—In type, Sn—Bi type, and Sn—Cd type) and so on, and preferably is a lead-free alloy. If utilizing Sn (tin) alloy in the fuse material 700, then metal bonding by ultrasonic welding will prove difficult so that as shown in FIG. 13, the fuse melting section 705 may be comprised of Sn alloy and the fuse bonding section 706 may be comprised of Cu (copper) alloy or Al (aluminum) alloy. These sections may then be bonded by brazing or caulking, etc.

The process for assembling the power module is described next while referring to (a) through (f) in FIG. 14. In a first process as shown in (a) of FIG. 14, a IGBT328, 330 and diodes 156, 158 are mounted over a conduction plate 315 and a conduction plate 316 coupled to a DC positive terminal 315B. Moreover, a conduction plate 319 and conduction plate 318 are then coupled to the IGBT328, 330 and the diodes 156, 158.

Figure 14:
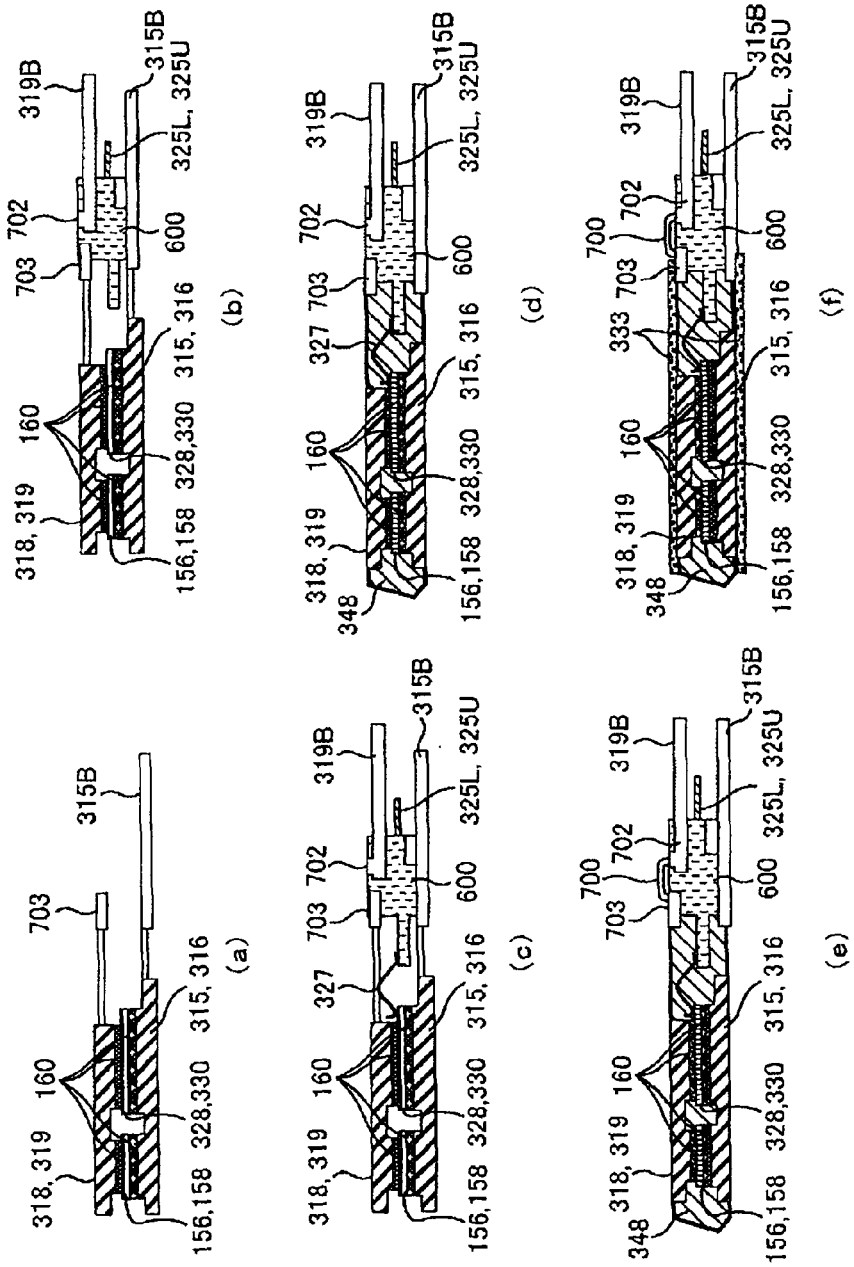
FIG. 14 is a drawing showing the first through the sixth assembly process of the power module of the present embodiment.

In a second process as shown in (b) of FIG. 14, the auxiliary mold piece 600 is inserted between the DC positive terminal 315B and the DC negative terminal 319B, and clamped so as to position the DC positive wire 315A and the DC negative wire 319A.

In a third process as shown in (c) of FIG. 14, the signal conductor 324 is joined to the gate electrode of each IGBT328, 330 by the wire bonding 327.

In a fourth process as shown in (d) of FIG. 14, a so-called transfer mold process is performed to seal the power module assembled as in (c) of FIG. 14 with the resin material.

In a fifth process as shown in (e) of FIG. 14, the fuse material 700 is attached.

In a sixth process as shown in (f) of FIG. 14, a resin insulation layer 333 is adhered to both ends of the power module from the transfer mold (process).

The fuse material 700 is formed as a separate piece from the DC negative wire 319A and the DC negative terminal 319B and mounted on the negative terminal side. There is no problem with installing the fuse material on both the positive and negative terminal sides but installing the fuse 700 only on the negative terminal side will boost productivity since the positive terminal side is assembled downwards in all the assembly processes.

The reason the positive terminal side is assembled downwards in all the assembly processes lies in the IGBT structure. The gate electrode is generally formed on the emitter side of the IGBT. During power module assembly process, if the power module is assembled with the negative terminal side downwards, then the bond is made by soldering from the emitter side of the IGBT, and the bonding surface area between the IGBT and the metal conductor becomes smaller than when solder bonding from the IGBT collector side. The IGBT might therefore peel away or the IGBT itself might deviate away from its assembly position due to the stress applied during the assembly process to cause the problem of low reliability. In the above process (of the invention), the positive terminal side is always down or in other words, the bond is made by soldering from the IGBT collector side so that there is a large bonding surface area between the IGBT and metal conductor. Therefore, when stress is applied during the assembly process, a semiconductor device such as the IGBT will not tend to peel away, and moreover the IGBT will not tend to deviate (from the assembly position) so that the reliability of the power module is improved.

Figure 15:
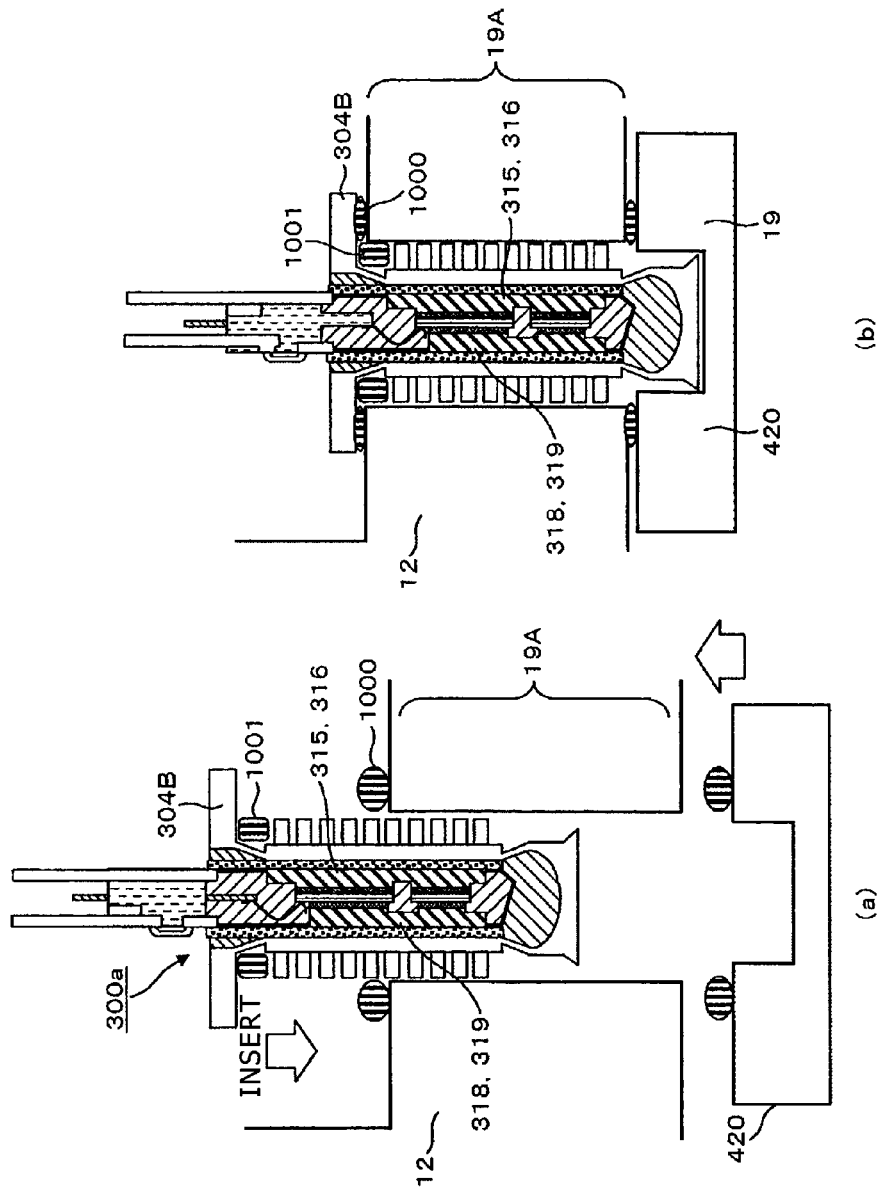
FIG. 15 is drawings for describing the assembly process of the power module into the cooling jacket of the present embodiment.

FIG. 15 is drawings for describing the process for assembling the power module 300 into the cooling jacket 12 of the power converter. The cooling jacket 12 is cooling section formed by the flow passage 19 where the cooling medium flows. An open section is formed on the upper section (of the cooling jacket 12), and moreover an (another) open section is formed on the side opposite this open section. The power module 300 is inserted from that open section, and the seal 1000 and a flange 304B of the module case 304 prevent leakage of the cooling medium. Water for example may be utilized as the cooling medium.

In order to make the module smaller in the above described structure, the upper arm circuit enclosed by conduction plates 315 and 318, and lower arm circuit enclosed by conduction plates 316 and 319 are mounted arrayed along the direction of the cooling medium flow. Moreover this structure makes the thickness of the module thinner so that the flow resistance to the cooling medium flow can be lower.

Further, the upper arm circuit or lower arm circuit are fabricated from tow power semiconductor devices respectively coupled in parallel. These two parallel-coupled power semiconductor devices are mounted arrayed along the direction of coolant flow between the conduction plates 315 and 318, or between the conduction plates 316 and 319. This structure allows a smaller overall module size.

As described in the above embodiment, by accommodating the module primary sealing piece 302 containing an internal upper/lower arm circuit (shown in (b) of FIG. 6) and the resin insulation sheet 333 of power module 300 in a fully sealed, seamless module case 304, the internal upper/lower arm circuit and the resin insulation sheet 333 can be protected from penetration by the cooling medium.

Also, the heat emitted from the power semiconductor device during operation is dissipated from both sides by the conduction plates and conveyed to the insulation sheet 333, and dissipated by the heat emission surfaces 307A, 307B of the module case 304 and the fins 305 so that high cooling performance is achieved in a structure that is highly reliable and capable of a high current density.

An auxiliary mold piece 600 comprised of insulating resin material is enclosed between and mates with the DC positive wire 315A and the DC negative wire 319A, so that the DC positive wire 315A and the DC negative wire 319A are mounted opposite and roughly in parallel while maintaining their insulating characteristics and support high reliability. Therefore along with maintaining reliable insulation to achieve low inductance, and a higher degree of freedom to cope with the high-speed switching operation of the power converter, a satisfactory current balance is obtained. Consequently, the power modules 300 can be coupled in parallel, and a power converter is achieved whose current-carrying capacity can be expanded as needed.

The melting of the fuse material 700 cuts off the excessive electrical current 800, and along with preventing gas decomposition of the sealer resin induced by the internal temperature of the power module 300, there is no danger of fluid leakage occurring since melting will occur outside the module case 304 and cooling jacket 12 so that unforeseen major damage can reliably be prevented in advance.

Figure 16:
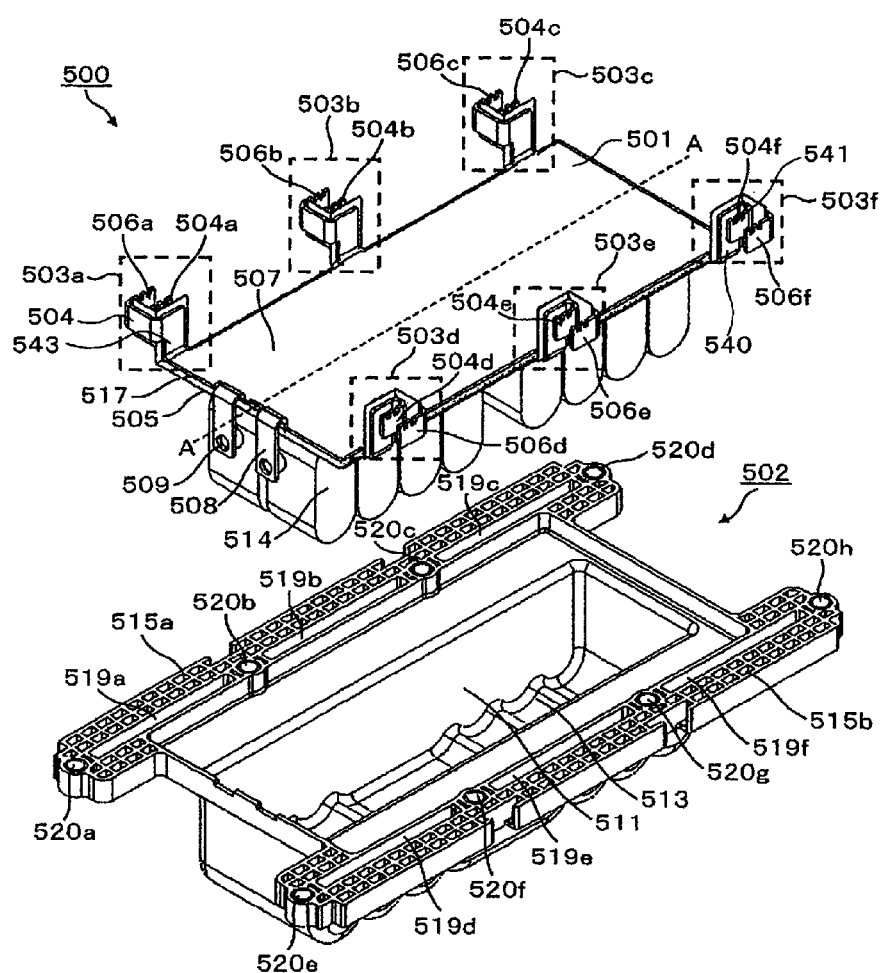
FIG. 16 is an exploded perspective view of the condenser module of the present embodiment.

FIG. 16 is an exploded perspective view of the condenser module 500 of the present embodiment.

A laminated conduction plate 501 is comprised of a negative conduction plate 505 and positive conduction plate 507 formed as a thin plate-shaped, wide-width conductor, and an insulation sheet 517 enclosed by the negative conduction plate 505 and the positive conduction plate 507 to attain a low inductance. The laminated conduction plate 501 is formed in a roughly rectangular shape. The battery positive terminal 508 and the battery negative terminal 509 are formed in an upraised state from one side along the short direction of the laminated plate 501.

The condenser terminals 503a-503c are formed in an upraised shape from one side in the longitudinal direction of the laminated conduction plate 501. The condenser terminals 503d-503f are formed in an upraised state from the other side along the longitudinal direction of the laminated conduction plate 501. The condenser terminals 503a-503f are upraised across the main surface of the laminated conduction plate 501. The condenser terminals 503a-503c are respectively coupled to the power module 300a-300c. The condenser terminals 503d-503f are respectively coupled to the power modules 301a-301c. A portion of the insulating sheet 517 is mounted between the positive side of condenser terminal 506a and the negative side of condenser terminal 504a contained in the condenser terminal 503a to provide insulation. This same state is also provided in the other condenser terminals 503b-503f. In the present embodiment, the negative conduction plate 505, positive conduction plate 507, battery positive terminal 508, battery negative terminal 509, condenser terminals 503a-503f are integrated into one metal plate to lower the inductance and improve the productivity.

A plurality of condenser cells 514 are mounted below the laminated conduction plate 501. In the present embodiment, eight condenser cells 514 are arrayed in a row along one side in the longitudinal direction of the laminated conduction plate 501, moreover, a separate eight condenser cells 514 are arrayed in a row along the other side in the longitudinal direction of the laminated conduction plate 501, so a total of sixteen condenser cells are mounted. The condenser cells 514 arrayed along the respective sides longitudinally on laminated conduction plate 501 are arrayed symmetrically along the boundary of the dashed line AA shown in FIG. 16. The electrical current balance between the condenser terminals 503a-503c and the condenser terminals 503d-503f is in this way made uniform when supplying DC electrical current smoothed by the condenser cell 514 to the power modules 300a-300c and the power modules 301a-301c, and a low inductance can be attained in the laminated conduction plate 501. Moreover, the laminated conduction plate 501 functions to prevent the localized flow of electrical current so that the thermal balance is uniform and the heat resistance is improved.

The battery positive terminal 508 and battery negative terminal 509 are also arrayed symmetrically along the boundary of the dashed line AA shown in FIG. 16. The electrical current balance between the condenser terminals 503a-503c and the condenser terminals 503d-503f can therefore be made uniform, a lower inductance can be attained in the laminated conduction plate 501, a uniform thermal balance is achieved and the thermal or heat resistance also improved.

The condenser cells 514 of the present embodiment are single unit electrical storage units of the condenser module 500. The condenser cells 514 utilize a film condenser having two layers of film with vapor-deposited metal such as aluminum wound on one side and the positive terminals and the negative terminals utilize each of the two metal sheets. The electrodes for the condenser cell 514 are produced by winding (the film) on the respective axial surfaces to form the positive terminal and negative terminal, and a conductor such as tin is then blown on.

The condenser case 502 includes a storage section 511 to store the condenser cell 514, and the upper surface and lower surface of applicable storage section 511 form a roughly rectangular shape. A flange section 515a is formed on one side along the longitudinal direction of the storage section 511 and a flange section 515b is formed on the other side (along the longitudinal direction of storage section 511). Through holes 519a-519c are formed in the flange section 515a to allow passage of the respective terminals extending from the insertion slot 306 of the module case 304. The through holes 519d-519f are formed in the same way in the flange section 515b. The holes 520a-520h are formed on the respective sides of the through holes 519a-519f to allow passage of a clamping scheme for clamping the condenser module 500 to the cooling jacket 12. The sealing between the power module and the flow passage 19 is enhanced by forming a hole 520b, hole 520c, hole 520f, and hole 520g. The flange section 515a and the flange section 515b are formed as a honeycomb structure to improve the clamping strength to the cooling jacket 12 and to lighten the condenser case 502.

The bottom section 513 of the storage section 511 is formed in a smooth irregular (convex/concave) shape or wave shape to match the surface contours of the cylindrical condenser cell 514. Positioning of the module coupled to the laminated conduction plate 501 and condenser cell 514 into the condenser case 502 is in this way improved. After placing the laminated conduction plate 501 and condenser cell 514 into the condenser case 502, a filler material (not shown in drawing) is filled into the condenser case 502 so as to cover the laminated conduction plate 501 except for the condenser terminals 503a-503f, battery positive terminal 508, and battery negative terminal 509. Making the bottom section 513 into a wave shape to match the shape of the condenser cell 514 prevents the condenser cell 514 from deviating from its specified position during the filling of filler material into the condenser case 502.

The condenser cell 514 emits heat due to electrical resistance of the internal conductor and from the metal thin film vapor-deposited over the internal film, due to the ripple current that flows during switching. Whereupon the heat from the condenser cell 514 tends to easily escape to the condenser case 502 so the condenser cell 514 is formed as a mold with filler material. The moisture-proofing of the condenser cell 514 can be further improved by utilizing a resin filler material.

Moreover in the present embodiment, the condenser module 500 is mounted so that the side walls forming the longitudinal side of the storage section 511 is enclosed by the flow passage 19 to allow efficiently cooling the condenser module 500. The condenser cell 514 is mounted so that one of the electrode surfaces of applicable condenser cell 514 is opposite the inner wall forming the side of storage section 511 in the longitudinal direction. The heat therefore tends to be easily conveyed along the axis that the film is wound so that the heat can easily escape by way of the electrode surfaces of condenser cell 514 and into the condenser case 502.

Figure 17:
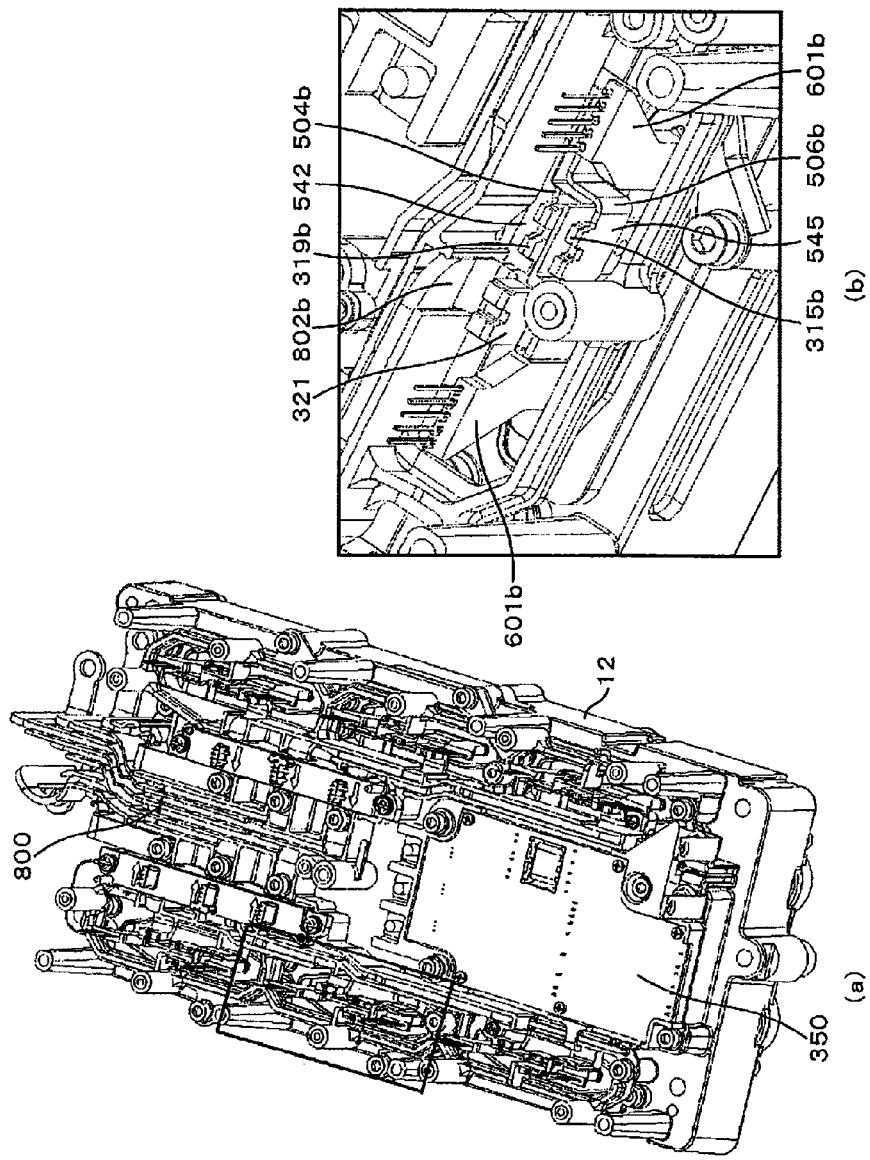
FIG. 17 is drawings of the power module, condenser module, and bus bar module assembled into the cooling jacket of the present embodiment.

(a) of FIG. 17 is an external perspective view of the power module, condenser module, and bus bar module assembled onto the cooling jacket 12. (b) of FIG. 17 is an enlarged view of the section enclosed by the solid lines in (a) of FIG. 17.

As shown in (b) of FIG. 17, the DC positive terminal 315B, DC negative terminal 319B, AC terminal 321, and external signal terminals 325U, 325L extend by way of the through hole 519 of condenser case 502, to above the flange section 515a. The surface area of the electrical current flow paths for the DC positive terminal 315B and the DC negative terminal 319B are drastically smaller than the surface area of the electrical current flow path of the laminated conduction plate

501. The surface area of the electrical current flow path therefore fluctuates to a large extent during flow of electrical current from the laminated conduction plate 501 to the DC positive terminal 315B and the DC negative terminal 319B. In other words, the electrical current is concentrated near the DC positive terminal 315B and the DC negative terminal 319B. Moreover when the DC positive terminal 315B and the DC negative terminal 319B protrude in a direction across the laminated conduction plate 501 or restated in other words, the DC positive terminal 315B and the DC negative terminal 319B are twisted relative to the laminated conduction plate 501, then a new conductor piece is required, causing the problem of low productivity and a high costs.

Whereupon in the present embodiment, the negative side condenser terminal 504a is comprised of an upright section 540 rising from the laminated conduction plate 501, a fold section 541 bent into a U shape and coupling to the applicable upright section 540, and a coupling section 542 connected to the applicable fold section 541 and also whose structure opposite the upright section 540, faces opposite the main surface of the DC negative terminal 319B. The positive side condenser terminal 506a is comprised of an upright section 543 rising from the laminated conduction plate 501, a fold section 544, and a coupling section 545 coupled to the applicable fold section 544 and also whose surface opposite the upright section 543, faces opposite the main surface of the DC positive terminal 315B. The fold section 544 in particular, is structured to couple to the upright section 543 at roughly a right angle, and further to span the side section of DC negative terminal 319B, negative side condenser terminal 504a, and DC positive terminal 3153. The main surface of the upright section 540 and the main surface of the upright section 543 face opposite each other by way of the insulation sheet 517. In the same way, the main surface of the fold section 541 and the main surface of the fold section 544 face opposite each other by way of the insulation sheet 517.

The condenser terminal 503 in this way forms a laminated structure by way of an insulation sheet 517 just before the coupling section 542 so that the wiring inductance can be lowered in the applicable condenser terminal 503a where the electrical current flow concentrates.

The fold section 544 is structured so as to span the sides of the DC negative terminal 319B, the negative side condenser terminal 504a, and the DC positive terminal 315B. The tip of the DC negative terminal 319B and side of the coupling section 542 are coupled by welding, and the tip of the DC positive terminal 315B and side of the coupling section 545 are coupled by welding in the same way.

The above arrangement eliminates interference from the fold section 544 and the work direction for coupling the DC negative terminal 319B and DC positive terminal 315B by welding so that the productivity can be enhanced while low inductance is achieved.

The tip of the AC terminal 321 is coupled to the tip of the AC bus bar 802a by welding. Modifying the welding production equipment to allow the welding equipment to move in a plurality of directions to match the welding target object is not a preferred method in terms of productivity and cost due to having to make the production equipment more complex. Whereupon in the present embodiment, the welding points for the AC terminal 321 and the DC negative terminal 319B are arrayed in a straight line along the side of the cooling jacket 12 in the longitudinal direction. This arrangement allows the welding machine to move in one direction, makes a plurality of welds and improves the productivity.

Moreover, as shown in FIG. 4 and (a) of FIG. 17, the plural power modules 300a-300c are mounted arrayed in a straight line along the side of the cooling jacket 12 in the longitudinal direction. Welding the plural power modules 300a-300c in this way, can improve the productivity even further.

Figure 18:
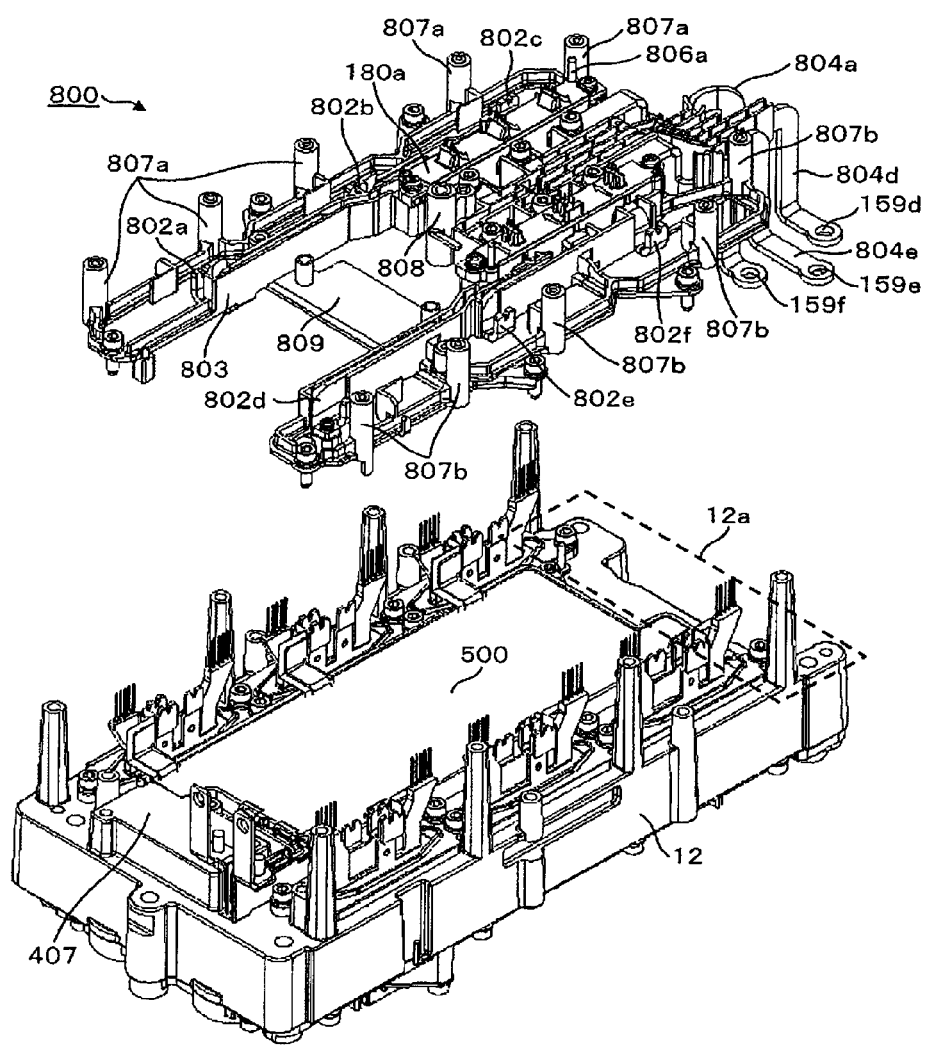
FIG. 18 is drawings showing the cooling jacket assembled the power module and condenser module, as well as the disassembled bus bar module of the present embodiment.
Figure 19:
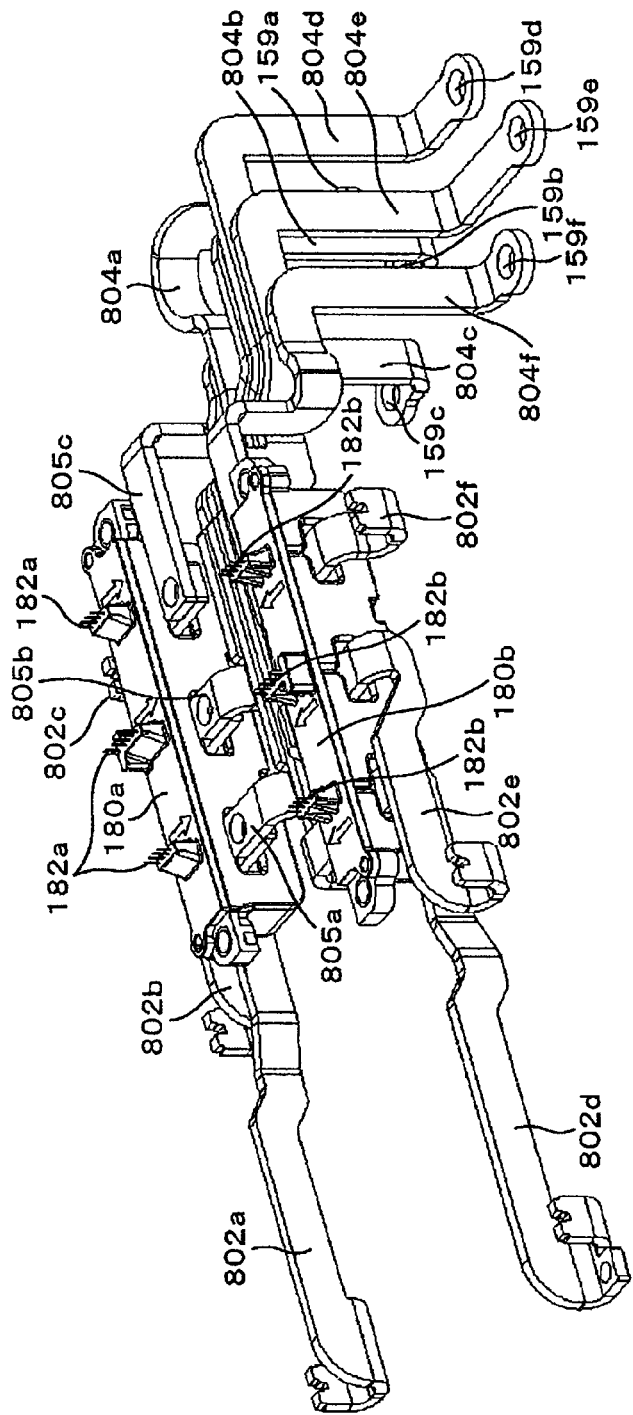
FIG. 19 is a perspective view of the bus bar module of the present embodiment.

FIG. 18 is exploded, perspective drawings of the bus bar module 800 and the cooling jacket 12 assembled onto the power module and condenser module. FIG. 19 is a perspective view of the bus bar module 800 not including a holding member 803. A condenser case 502 as shown in FIG. 16 is mounted between the fuse material 700 mounted in the power module 300, and the positive conduction plate 505 and negative conduction plate 507 mounted in the condenser module 500. The flange sections 515a, 515b of condenser case 502 present between the positive conduction plate 505 and negative conduction plate 507 and the fuse material 700. The DC positive terminal 315B and DC positive terminal 319B protrude from the through holes 519 formed in the flange sections 515a, 515b of the condenser case 502, and extend away from the openings formed in the flow path. In this type of structure, the positive conduction plate 505 and negative conduction plate 507 are protected by the flange sections 515a, 515b of the condenser case 502. There is therefore no effect up to the positive conduction plate 505 and negative conduction plate 507 even for example if the fuse material 700 melts so that reliability is improved since damage can be suppressed to a minimum.

As shown in FIG. 18 and FIG. 19, the first AC bus bars 802a-802f are formed up to the mounting locations for the current sensors 180a or current sensor 180b, so that the main surface of the applicable first AC bus bars 802a-802f is roughly perpendicular to the main surface of the laminated conduction plate 501 of condenser module 500. The first AC bus bars 802a-802f are bent at an approximate right angle just in front of the through hole for the current sensor 180a or the through hole for the current sensor 180b. The main surface sections of the first AC bus bars 802a-802f passing through the through hole for current sensor 180a or the through hole for the current sensor 180b are in this way made approximately parallel to the main surface of the laminated conduction plate 501. The coupling sections 805a-805f are formed in order to couple the second AC bus bars 804a-804f to the ends of the first AC bus bars 802a-802f (coupling sections 805d-805f are not shown in the drawings).

The second AC bus bars 804a-804f are bent at an approximate right angle towards the side of the condenser module 500 in the vicinity of the coupling sections 805a-805f. The main surface of the second AC bus bars 804a-804f are in this way formed roughly perpendicular to the main surface of the laminated conduction plate 501 of condenser module 500. The second AC bus bars 804a-804f are moreover formed to extend from the vicinity of the current sensor 180a or the current sensor 180b towards the one side of the side 12a along the short direction of the cooling jacket 12 shown in FIG. 13 and to across the applicable side 12a. In other words, the main surfaces of the plural second AC bus bars 804a-804f are formed in a state where facing each other and the applicable second AC bus bars 804a-804f are arrayed across the side 12a.

The above arrangement allows a plurality of plate-shaped AC bus bars to protrude to the outside from the short side edge of the cooling jacket 12 without having to make the overall device large in size. Having the plural AC bus bars protrude from one side surface of the cooling jacket 12 also allows a simple wiring layout on the exterior of the power converter 200 to improve productivity.

As shown in FIG. 18, the first AC bus bars 802a-802f, the current sensors 180a-180b and the second AC bus bars 804a-804f are supported and insulated by the holding member 803 formed from resin. This holding member 803 improves the insulation characteristics of the second AC bus bars 804a-804f that are positioned between the cooling jacket 12 and the (aluminum) cabinet 119 made in the metal. By making thermal contact or direct contact with the cooling jacket 12, this holding member 803 allows the heat conveyed from the transmission 118 side to the second AC bus bars 804a-804f, to escape to the cooling jacket 12 so that the reliability of the current sensors 180a-180b can be improved As shown in FIG. 18, the holding member 803 includes the support members 807a and support members 807b for supporting the driver circuit board 22 shown in FIG. 4. A plurality of support members 807a are formed, and are moreover formed arrayed in a row along one longitudinal side of the cooling jacket 12. A plurality of the support members 807b are also formed and are moreover formed arrayed in a row the other longitudinal side of the cooling jacket 12. A screw hole for clamping the driver circuit board 22 is formed in the tip of the support members 807a and support members 807b.

The holding member 803 also includes the projection 806a and the projection 806b extending upwards from the point where the current sensor 180a and the current sensor 180b are mounted. The projection 806a and the projection 806b are each structured so as to pass through the current sensor 180a and the current sensor 180b. As shown in FIG. 19, the current sensor 180a and the current sensor 180b include the signal lines 182a and the signal lines 182b extending towards the driver circuit board 22 mounting position. The signal lines 182a and the signal lines 182b are coupled to the circuit pattern over the driver circuit board 22 by soldering. In the present embodiment, the holding member 803, the support members 807a-807b and the projections 806a-806b are formed as one integrated resin piece.

The holding member 803 in this way provides a positioning function for the current sensor 180 and the driver circuit board 22 so that the assembling and solder coupling between the signal line 182a and the driver circuit board 22 becomes simple. Moreover, the holding member 803 also includes a mechanism to support the current sensors 180 and the driver circuit board 22 so that the number of parts in the overall power converter can be reduced.

The power converter 200 of the present embodiment is clamped to the cabinet 119 that contains a transmission 118 and so is greatly affected by vibration from the transmission 118. Whereupon, the holding member 803 includes a support member 808 to support the vicinity of the center section of the driver circuit board 22 in order to reduce effects from vibration applied to the driver circuit board 22. The holding member 803 is clamped by a screw to the cooling jacket 12.

The holding member 803 includes a bracket 809 to clamp one end of the auxiliary unit power module 350. As shown in FIG. 4, mounting the auxiliary unit power module 350 over the protruding section 407 clamps the other end of the auxiliary unit power module 350 to the applicable protruding section 407. The effect from vibrations applied to the auxiliary unit power module 350 can in this way be lessened and the number of clamping parts can also be reduced.

Figure 20:
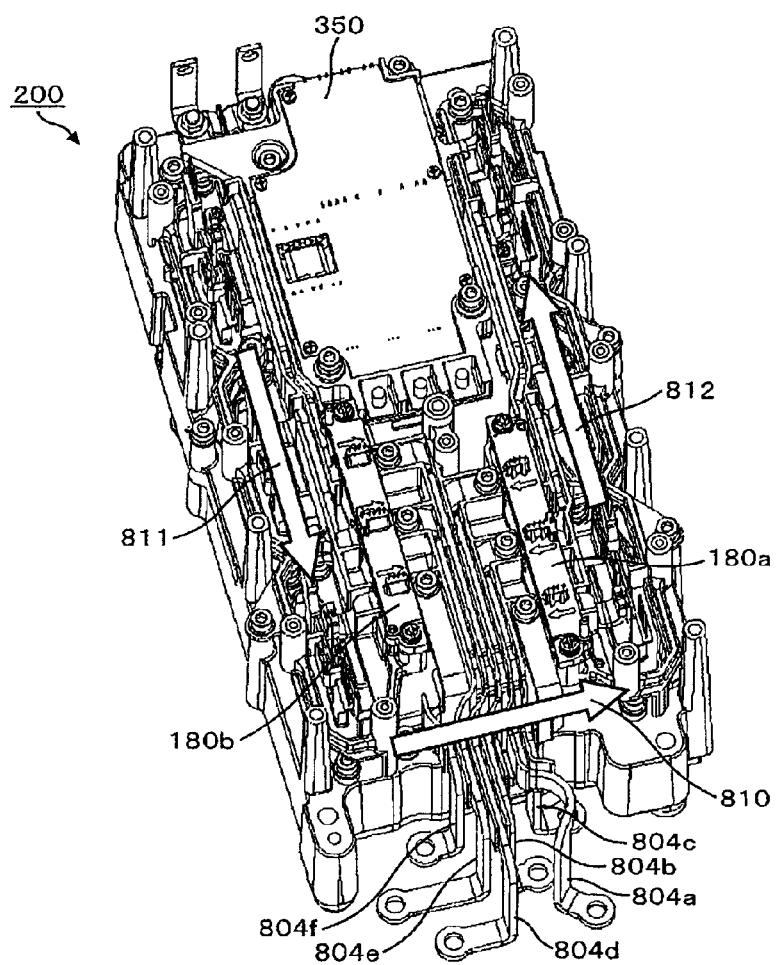
FIG. 20 is an external perspective view of the cooling jacket assembled the power module, condenser module, bus bar module, and auxiliary unit power module of the present embodiment.

FIG. 20 is an external perspective view of the cooling jacket 12 assembled the power module, condenser module, bus bar module 800, and auxiliary unit power module 350.

The current sensor 180 might possibly be destroyed if heated beyond its heat withstand temperature of approximately 100° C. The usage environment particularly in the case of power converters installed in vehicles reaches extremely high temperatures so that protecting the current sensor 180 from heat is very important. In the case of the present embodiment in particular, a transmission 118 is mounted in the power converter 200 so that providing protection from the heat emitted by the applicable transmission 118 is important.

Whereupon, in the present embodiment, the current sensor 180a and the current sensor 180b are mounted on the side opposite the transmission 118 so as to enclose the cooling jacket 12. This arrangement makes transmission of heat from the transmission 118 to the current sensor difficult and prevents the temperature in the current sensor from rising. Moreover, the second AC bus bars 804a-804f are formed so as to cross the flow direction 810 of the coolant flowing in the third flow passage section 19c shown in FIG. 5. The current sensor 180a and the current sensor 180b are mounted on the side nearer to the AC terminal 321 of the power module than the section of the second AC bus bars 804a-804f crossing the third flow passage section 19c. The second AC bus bars 804a-804f are in this way indirectly cooled and the heat conveyed from the AC bus bar to the current sensor, and also to the semiconductor chip within the power module can be alleviated even further so that the reliability is improved.

The flow direction 811 shown in FIG. 20 indicates the flow direction of the coolant flow in the fourth flow passage section 19d shown by FIG. 5. The flow direction 812 in the same way indicates the flow direction of coolant in the second flow passage section 19b shown in FIG. 5. The current sensor 180a and the current sensor 180b of the present embodiment are mounted so their transparently viewed sections are enclosed by the flow passage 19 section as transparently viewed from above the power converter 200. This arrangement allows protecting the current sensors from heat emitted by the transmission 118 to an even greater extent.

The current sensor 180 might possibly be destroyed if heated beyond its heat withstand temperature of approximately 100° C. The usage environment particularly in the case of power converters installed in vehicles reaches extremely high temperatures so that protecting the current sensor 180 from heat is very important. In the case of the present embodiment in particular, the power converter 200 is mounted in a transmission 118 so that providing protection (for the current sensor 180) from the heat emitted by the applicable transmission 118 is important.

Whereupon, in the present embodiment the current sensor 180a and the current sensor 180b are mounted on the side opposite the transmission 118 so as to enclose the cooling jacket 12. This arrangement makes the conveying of heat from the transmission 118 to the current sensor difficult and prevents the temperature in the current sensor from rising. Moreover, the second AC bus bars 804a-804f are formed so as to cross the flow direction 810 of the coolant flowing in the third flow passage section 19c shown in FIG. 5. The current sensor 180a and the current sensor 180b are mounted on the side nearer to the AC terminal 321 of the power module than the section of the second AC bus bars 804a-804f crossing the third flow passage section 19c. The second AC bus bars 804a-804f are in this way indirectly cooled and the heat conveyed from the AC bus bar to the current sensor, and also to the semiconductor chip within the power module can be alleviated even further so that the reliability is improved.

The flow direction 811 shown in FIG. 20 indicates the flow direction of the coolant flow in the fourth flow passage section 19d shown by FIG. 5. The flow direction 812 in that same way indicates the flow direction of coolant in the second flow passage section 19b shown in FIG. 5. The current sensor 180a and the current sensor 180b of the present embodiment are mounted so their transparently viewed sections are enclosed by the flow passage 19 section as transparently viewed from above the power converter 200. This arrangement allows protecting the current sensors from the heat emitted by the transmission 118 to an even greater extent.

Figure 21:
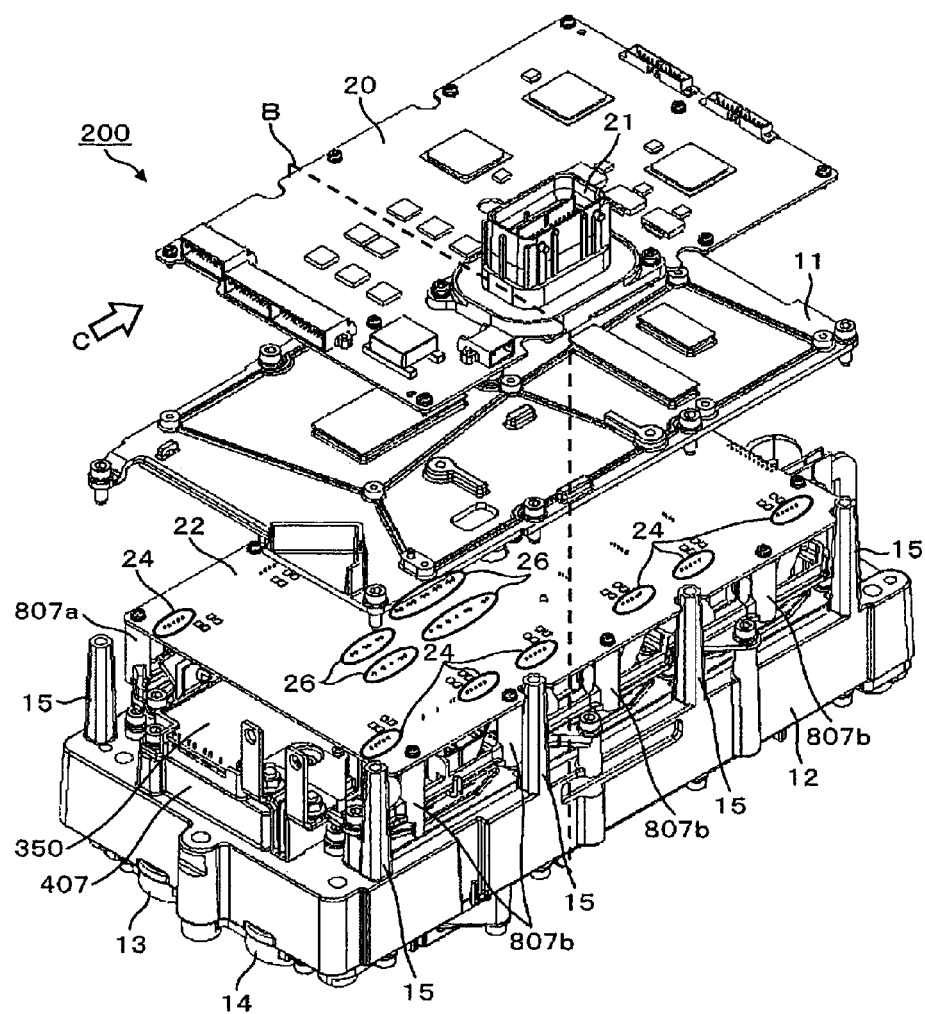
FIG. 21 is an exploded perspective view of the power converter separated into a metal base and control circuit board of the present embodiment.

FIG. 21 is an exploded perspective view of the power converter 200 separated into a metal base plate 11 and the control circuit board 20. The driver circuit board 22 is clamped to the support members 807a and 807b formed over the bus bar module 800. The driver circuit board 22 is moreover mounted higher than the DC positive terminal 315B and DC negative terminal 319B protruding out from the through holes 519 formed in the flange section 515a and 515b of the condenser case 502. The related structure alleviates the effect from heat on the driver circuit board 22 if the fuse material 700 melts so that destruction of the driver circuit board 22 is less likely and the reliability is improved.

The cooling jacket 12 includes a support member 15. The support member 15 extends away from the opening 400 formed in the cooling jacket 12. The control circuit board 20 is clamped to the metal base plate 11 supported on this support member 15. The metal base plate 11 is mounted higher than the DC positive terminal 315B and DC negative terminal 319B. The metal base plate 11 is therefore mounted in this way between the control circuit board 20 and the fuse material 700 so that there is little effect from heat applied to the control circuit board 20 when the fuse material 700 has melted, so that destruction is not likely to occur and reliability is improved.

As shown in FIG. 20, the current sensor 180 is mounted above the condenser module 500. The driver circuit board 22 is mounted above the current sensor 180, and further is supported by the support members 807a and 807b mounted in the bus bar module 800 shown in FIG. 13. The metal base plate 11 is mounted above the driver circuit board 22 and moreover is supported by a plurality of support members 15 erected upwards from the cooling jacket 12. The control circuit board 20 is mounted above the metal base plate 11 and moreover is clamped to the metal Switching noise can be suppressed since the current sensor 180, driver circuit board 22, and the control circuit board 20 are mounted in layers in a single row in the height direction, and the control circuit board 20 moreover is mounted at the location farthest from the power module 300 and 301 with their powerful electrical fields. The metal base plate 11 is moreover electrically coupled to the cooling jacket 12 that is electrically coupled to ground. This metal base plate 11 serves to reduce noise penetrating into the control circuit board 20 from the driver circuit board 22.

In the present embodiment, since the coolant flowing in the flow passage 19 is mainly for driving the power modules 300 and 301, the applicable power module 300 and 301 housed within the flow passage 19 are cooled by direct contact with the coolant. The auxiliary unit power module 350 on the other hand also requires cooling though not to the same extent as the drive power modules.

Whereupon in the present embodiment, the heat emitting surface formed from the metal base of the auxiliary unit power module 350 is formed to face opposite the inlet pipe 13 and the outlet pipe 14 by way of the flow passage 19. The protruding section 407 for clamping the auxiliary unit power module 350 is in particular formed above the inlet pipe 13 so that the downward flow of the coolant strikes the inner wall of the protruding section 407 and efficiently absorbs the heat from the auxiliary unit power module 350. A space joining to the flow passage 19 is moreover formed in the interior of the protruding section 407. This space in the interior of the protruding section 407 causes a greater depth in the flow passage 19 in the vicinity of the inlet pipe 13 and outlet pipe 14 so that fluid accumulates in the space in the interior of the protruding section 407. This accumulated fluid can efficiently cool the auxiliary unit power module 350.

Making use of a wiring connector to electrically couple the current sensor 180 to the driver circuit board 22 may cause a larger number of coupling steps (processes) and lead to the hazard of wiring errors.

Whereupon, as shown in FIG. 21, in the driver circuit board 22 of the present embodiment, a first hole 24 and a second hole 26 are formed so as to pass through the applicable driver circuit board 22. An external signal terminal 325U and an external signal terminal 325L from power module 300 are inserted into the first hole 24, and this external signal terminal 325U and an external signal terminal 325L are joined to the wiring pattern of driver circuit board 22 by soldering. Moreover, a signal line 182 of the current sensor 180 is inserted into the second hole 26, the signal line 182 is connected to the wiring pattern of driver circuit board 22 by soldering. The soldering is performed from the driver circuit board 22 surface side which is opposite the side facing the cooling jacket 12.

The signal line can in this way coupled without utilizing a wiring connector so that the productivity is improved. Moreover, the productivity can be even further improved by coupling the external signal terminal 325 of the power module 300 with the signal line 182 of the current sensor 180 by soldering from the same direction. Also, respectively forming a first hole 24 for passage of the external signal terminal 325 or second hole 26 for passage of the signal line 182 in the driver circuit board 22 allows minimizing the danger of coupling errors.

The driver circuit board 22 of the present embodiment contains a drive circuit (not shown in drawing) such as a driver IC chip mounted on the side of the board that is the side opposite the cooling jacket 12. This arrangement serves to suppress heat conveyed from the solder coupling to the driver IC chip and elsewhere and in this way prevents damage to the driver IC chip or other components due to the solder coupling. Large height components such as transformers mounted on the drive circuit board 22 are mounted in the space between the condenser module 500 and the driver circuit board 22 and so the entire power converter 200 can have a low overall contour.

Figure 22:
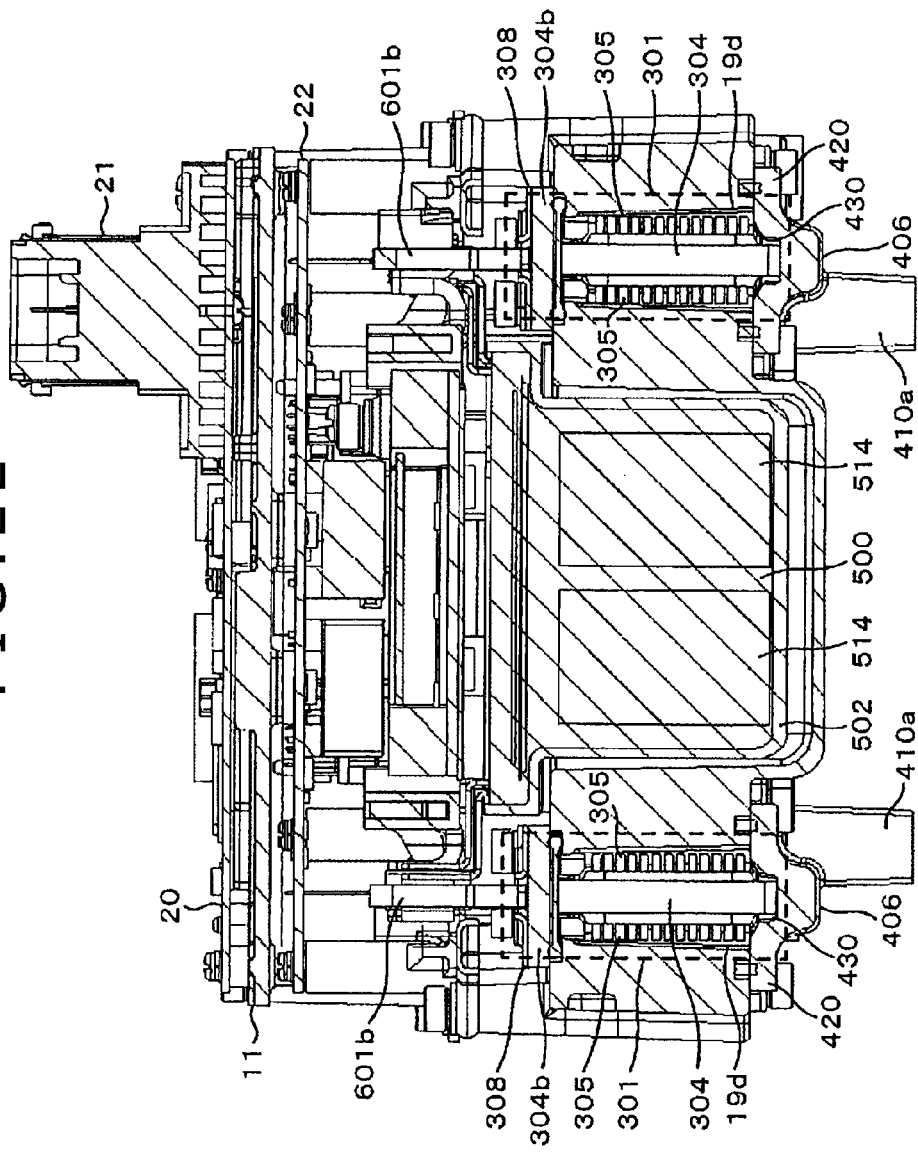
FIG. 22 is a cross sectional view of the power converter cut out on the B surface in FIG. 21.

FIG. 22 is a cross section view of the power converter 200 cut out from the B plane in FIG. 21 as seen from the C direction.

The flanges 304B mounted on the module case 304 are pressed against the cooling jacket 12 by the flange 515a or the flange 515b mounted over the condenser case 502. In other words, the sealing of the flow passage 19 is enhanced by the pressing of the module case 304 against the cooling jacket 12 by utilizing the self-weight of the condenser case 502 that houses the condenser cell 514.

Coolant within the flow passage 19 must be made to flow in the region formed by the fin 305 in order to improve the cooling efficiency for the power module 300. However in order to secure space for the bent sections 304A in the module case 304, no fins 305 are formed at lower section of the module case 304. The lower cover 420 is therefore formed so that the lower section of the module case 304 mates with the concave section 430 formed in the applicable lower cover 420. This arrangement serves to prevent coolant from flowing into the space where no coolant fin was formed.

As shown in FIG. 22, the power module 300, condenser module 500, and power module 301 are mounted arrayed in a direction so as to cross the direction that the control circuit board 20, driver circuit board 22, and transmission 118 are arrayed. The power module 300, condenser module 500, and power module 301 in particular are arrayed in the bottommost layer within the power converter 200. Along with allowing an overall lower contour (height) for the power converter 200, this arrangement reduces effects from vibrations from the transmission 118.

The above description of the first embodiment is now complete.

The second embodiment is described next. The second embodiment utilizes a different shape for the auxiliary mold piece 600. In all other points the second embodiment is the same as the first embodiment.

Figure 23:
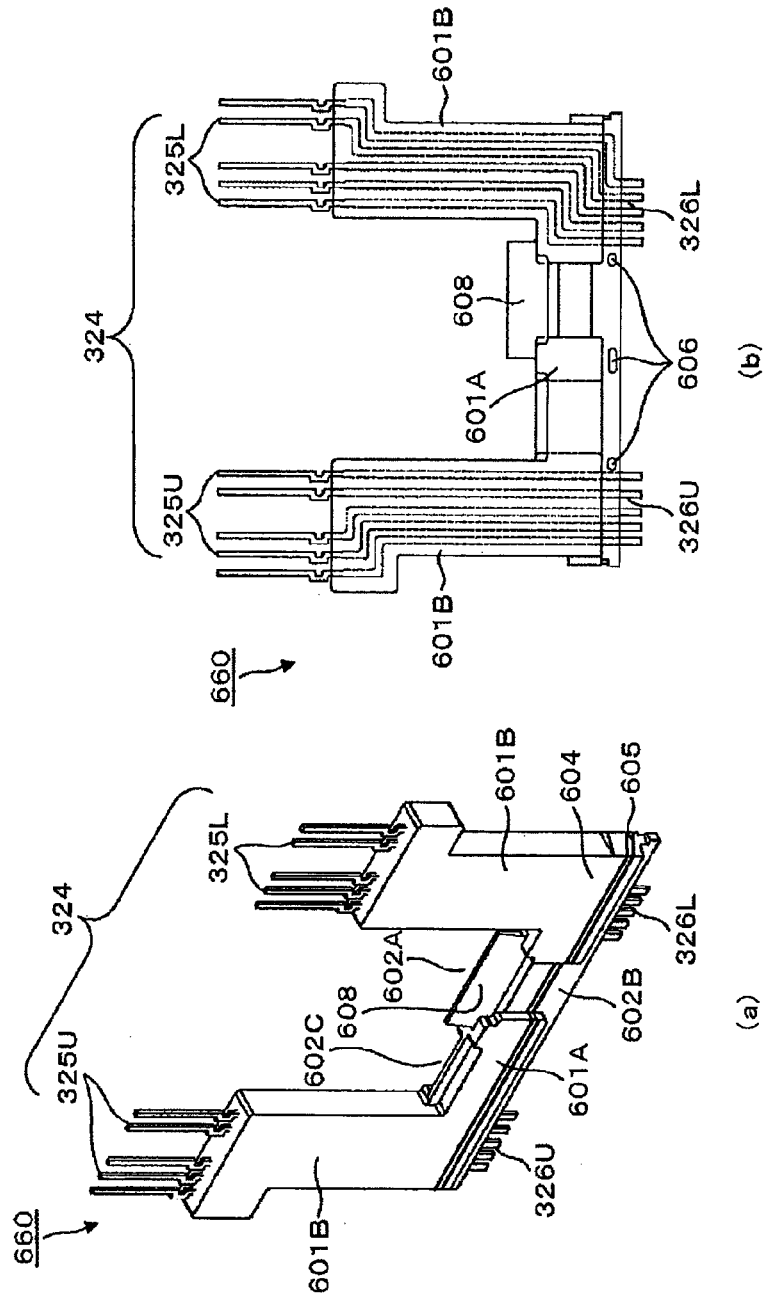
FIG. 23 is a perspective view and a transparent view of the auxiliary mold piece of the second embodiment.

(a) of FIG. 23 is a perspective view of the auxiliary mold piece 660 utilized in the second embodiment. (b) of FIG. 23 is a transparent view of the auxiliary mold piece 600.

The point here greatly differing from the first embodiment is that the DC positive terminal 315B and DC negative terminal 319B, and the AC terminal 321 are mounted between the external signal terminal 325U and external signal terminal 325L and supported in the auxiliary mold piece 660. This arrangement allows widening the welding space for the DC positive terminal 315B, DC positive terminal 319B, and the AC terminal 321 more than in the case when using the auxiliary mold piece 600 of the first embodiment. Widening the space for welding makes the signal conductor 324 less susceptible to effects from heat sustained during welding, and prevents destruction of the signal conductor 324 during welding. These structures enhance the productivity and the reliability.

A first sealer section 601A forms a shape extending in a direction across the longitudinal axis of the contour of the DC positive wire 315A and the DC negative wire 319A, or the alternating current (AC) wire 320 as shown in (a) of FIG. 23. A second sealer section 601B on the other hand, forms a shape extending in a direction approximately parallel to the longitudinal axis of the contour of the DC positive wire 315A and DC negative wire 319A, or the alternating current (AC) wire 320. The second sealer section 601B is comprised of a sealer section for sealing the external signal terminal 325U on the upper arm side, and a sealer section for sealing the external signal terminal 325L on the lower arm side. The signal wire 324 is covered by the second sealer section 601B so that there is no destruction of the signal wire 24 if for example the fuse material 700 melts, so that the reliability is improved.

The first sealer section 601A includes a wire fitting section 602B formed with a recess and for fitting the DC negative wire 319A in applicable recess. The first sealer section 601A also contains a wire fitting section 602A formed with a recess, and for fitting the DC positive wire 315A in said recess. The first sealer section 601A further contains a wire fitting section 602C positioned to the side of wire fitting section 602A and formed with a recess and for fitting the AC wire 320 into the applicable recess. The position of each wire can be set by fitting each of the wires into these wire fitting sections 602A-602C. The task of filling the resin sealer material can in this way be performed after securely clamping these wires, and the mass productivity improved.

A wiring insulator section 608 protrudes from between the wire fitting section 602A and wire fitting section 602B, towards a direction away from the first sealer section 601A. By forming the plate-shaped wiring insulator section 608 interposed between the DC positive wire 315A and DC negative wire 319A, the wires are installable at opposing positions to achieve a low inductance while also maintaining the insulation characteristics.

In the process for sealing the module primary sealing piece 302 with the first sealer resin 348, the auxiliary mold piece 600 supporting each wire is first of all inserted into a metal mold prewarming to approximately 150 to 180° C. In this embodiment, the auxiliary mold piece 600, the DC positive wire 315A, the DC negative wire 319A, the alternating current (AC) wire 320, the conduction plate 315, the conduction plate 316, the conduction plate 318, and the conduction plate 319 are each securely coupled so that mounting the auxiliary mold piece 600 in the specified position serves to mount the major circuits and the power semiconductor devices in their specified positions. Therefore, along with improving productivity, the reliability is also improved.

The second sealer section 601B forms a shape extending from the vicinity of the module case 304 to the vicinity of the driver circuit board 22. By performing the wiring with the driver circuit board 22 around high-intensity electrical field wiring, the switching signals can in this way still be conveyed normally even when exposed to high-intensity electrical fields. Moreover, the electrical insulation can be maintained and the reliability improved even the DC positive terminal wire 315A, the DC negative terminal wire 319A, the alternating current (AC) wire 320, the external signal terminal 325U and external signal terminal 325L protrude from the module case 304 towards the same direction.

The third embodiment is described next while referring to FIG. 24.

The point here greatly differing from the first embodiment is that the DC negative wire 319A, the DC negative terminal 319B, and the fuse material 700 are not assembled into the single sheet shape in the first embodiment. The present embodiment newly utilizes an insert bus bar 711 where the DC negative wire 319A, the DC negative terminal 319B, and the fuse material 700 area single-sheet shape. In all other points the third embodiment is the same as the first embodiment.

Figure 24:
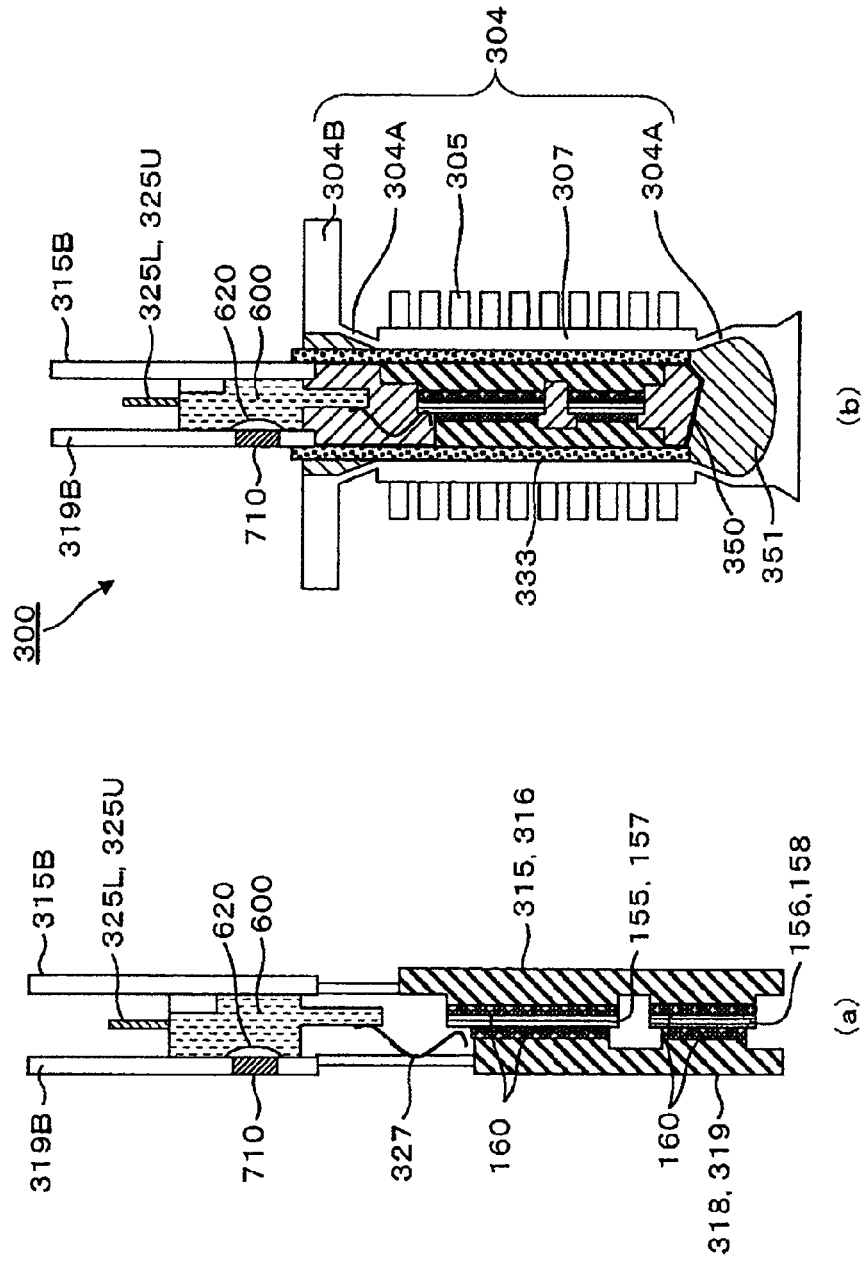
FIG. 24 is a cross sectional view of the power module of the third embodiment.

(a) of FIG. 24 is a view of the power module 300 without the module case 304 and the first sealer resin material 348. (b) of FIG. 24 is a view of the power module 300 in (a) of FIG. 24 installed in the module case 304. The fuse material 710 is adhered by caulking to the DC negative terminal 319B and the DC negative wire 319A. The first embodiment has the problem that the fuse material 700 is mounted away from the DC positive wire 315A so that the inductance increases somewhat more than when the DC positive wire and DC negative wire are mounted facing each other as one sheet. However, by forming the fuse material 710, the insert bus bar 711, and the DC negative wire 712 as one sheet serving as a negative conduction plate, the wiring on the negative terminal side can be made to face each other without mounting them away from the DC positive wire 315A. This structure lowers the overall circuit inductance, prevents an unforeseen rise in temperature high enough to melt the fuse material, and improves the reliability.

Including a recess section 620 which is a peripheral sunken section of the fuse material 710, on the negative conduction plate formed on the insert in the auxiliary mold piece 600, serves to keep the fuse material that easily emits heat, from making direct contact with the auxiliary mold piece 600, so there is no excessive rise in temperature in the auxiliary mold piece. This structure is therefore capable of preventing the fuse material from melting except in cases where abnormal heat emission occurred and so improves the reliability.

The third embodiment was described while utilizing the auxiliary mold piece 600 of the first embodiment, however, the auxiliary mold piece 600 of the second embodiment may also be utilized.

Figure 25:
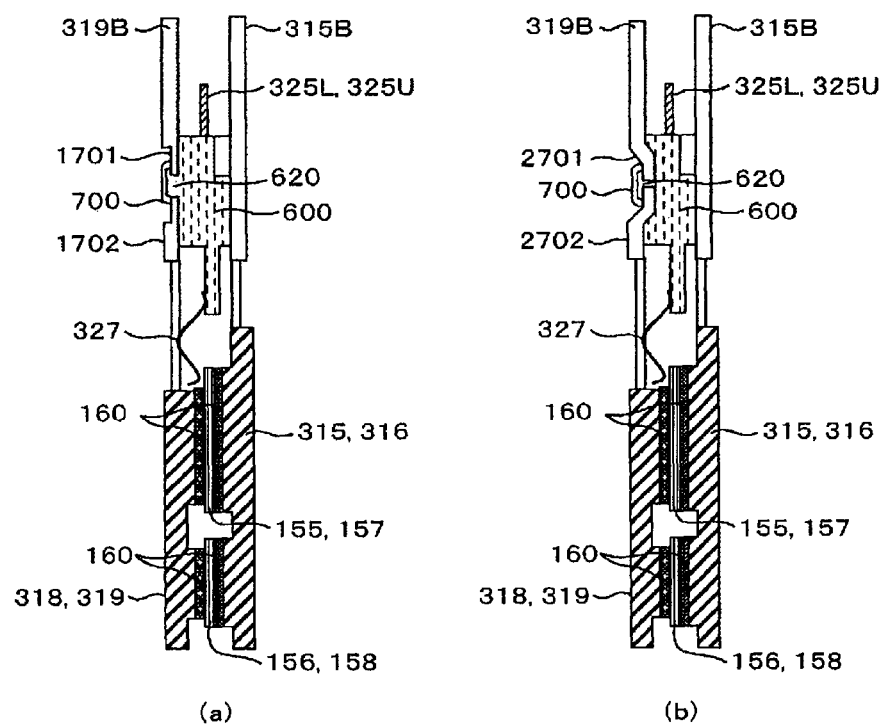
FIG. 25 is a cross sectional view of the power module of the fourth embodiment; and a cross sectional view of the power module of the fifth embodiment.

The fourth embodiment and the fifth embodiment are described next while referring to FIG. 25.

The fourth embodiment is first of all described. The point differing from the first embodiment is that the DC negative wire 319A of the first embodiment has a largely fixed thickness, and the DC negative terminal 319B is also a largely fixed thickness; however in the fourth embodiment the thickness of the exposed section 1701 and 1702 is thinner than the thickness of the DC negative wire 319A and DC negative terminal 319B, and the fuse material 700 can be installed in that section (space from thinner dimension). A view of this structure is shown in (a) of FIG. 25. This structure can suppress a rise in inductance with the fuse material 700 in proximity to the DC positive wire 315A more than in the first embodiment, so that if the fuse material 700 emits heat due to surge voltages that occur or for other reasons, then the melting of the fuse material 700 itself can be prevented, and the reliability can be improved.

The fifth embodiment is described next. The point differing from the first embodiment is that the exposed section 2702 coupled to the DC negative wire 319A and the exposed section 2701 coupled to the DC negative terminal 319B are formed bent. A view of this structure is shown in (b) of FIG. 25. Forming a bent exposed section 2701 and exposed section 2702 as shown in (b) of FIG. 25 allows bonding the fuse material 700 in proximity to the DC positive wire 315A. This structure can suppress a rise in inductance more than in the first embodiment, so that if the fuse material 700 emits heat due to surge voltages that occur or for other reasons, then the melting of the fuse material 700 itself can be prevented and the reliability can be improved.

The fourth and fifth embodiments were described while utilizing the auxiliary mold piece 600 of the first embodiment however the auxiliary mold piece 600 of the second embodiment may also be utilized.

A high reliability semiconductor device, power module and power converter including a power module can therefore be provided as shown in the above embodiments.

Various embodiments and adaptations were described above however the present invention is not limited by the content described therein. Other variations and adaptations not departing from the technical range and scale of the present invention may also be considered as within the scope of the present invention.

The contents disclosed in the following priority claim basic application are included by reference in this application.

Japanese Patent Application No. 2010-84780 (application of Apr. 1, 2010)

The invention claimed is:

1. A power converter comprising:
   a power module including a semiconductor chip, a sheet conductor coupled to a main surface of the semiconductor chip, a coupling terminal electrically coupled to a direct current power source, and a resin material to seal the sheet conductor;
   a flow passage forming piece including a flow passage for flow of a cooling medium; and
   a cooler with a bottom, including an open section, a first cooling surface, and a second cooling surface opposite the first cooling surface,
   wherein the cooler stores the power module,
   wherein the flow passage forming piece includes an opening coupling with the flow passage,
   wherein the cooler is immersed into the flow passage from the open section,
   wherein the resin material includes a protruding section protruding from the open section of the cooler,
   wherein the coupling terminal is clamped to the protruding section,
   wherein a portion of the sheet conductor is coupled to the coupling terminal by way of a metal material that melts at a specified temperature, and
   wherein the metal material is mounted on the protruding section of the resin material.

2. A power converter according to claim 1,
   wherein the main surface is one of a plurality of main surfaces of the semiconductor chip, the sheet conductor includes a first sheet conductor mounted opposite one of the main surfaces of the semiconductor chip, and a second sheet conductor mounted opposite the other main surface of the semiconductor chip, the first sheet conductor is mounted by way of the first insulation member opposite the first cooling surface, and the second sheet conductor is mounted by way of the second insulation member opposite the second cooling surface.

3. The power converter according to claim 2,
   wherein the cooler includes a flange section on one surface thereof formed with an open section, and
   wherein the flange section, on a side opposite the one surface, is clamped to the flow passage forming piece.

4. The power converter according to claim 3, further comprising:
   a condenser cell, and a condenser module including a condenser case to store the condenser cell,
   wherein the condenser case includes a flange section where holes are formed,
   wherein the coupling terminal of the power module passes through holes in the condenser case, and
   wherein the metal material is mounted in a space where the flange section of condenser case and the flange section of cooler are formed opposite to each other.

5. The power converter according to claim 1, further comprising:
   a driver circuit board to drive the semiconductor chip,
   wherein an edge of the coupling terminal extends in a direction away from the opening of the flow passage forming piece, and
   wherein a main surface of the driver circuit board is opposite the opening, and the driver circuit board is mounted above the edge of the coupling terminal.

6. The power converter according to claim 1, further comprising:
   a control circuit board to generate control signals for controlling the semiconductor chip; and
   a metal base to hold the control circuit board,
   wherein the metal base is mounted between the flow passage forming piece and the control circuit board.

7. The power converter according to claim 2, further comprising:
   a driver circuit board to drive the semiconductor chip,
   wherein an edge of the coupling terminal extends in a direction away from the opening of the flow passage forming piece, and
   wherein a main surface of the driver circuit board is opposite the opening, and the driver circuit board is mounted above the edge of the coupling terminal.

8. The power converter according to claim 3, further comprising:
   a driver circuit board to drive the semiconductor chip,
   wherein an edge of the coupling terminal extends in a direction away from the opening of the flow passage forming piece, and
   wherein a main surface of the driver circuit board is opposite the opening, and the driver circuit board is mounted above the edge of the coupling terminal.

9. The power converter according to claim 4, further comprising:
a driver circuit board to drive the semiconductor chip,
wherein an edge of the coupling terminal extends in a direction away from the opening of the flow passage forming piece, and
wherein a main surface of the driver circuit board is opposite the opening, and the driver circuit board is mounted above the edge of the coupling terminal.

10. The power converter according to claim 2, further comprising:
a control circuit board to generate control signals for controlling the semiconductor chip; and
a metal base to hold the control circuit board,
wherein the metal base is mounted between the flow passage forming piece and the control circuit board.

11. The power converter according to claim 3, further comprising:
a control circuit board to generate control signals for controlling the semiconductor chip; and
a metal base to hold the control circuit board,
wherein the metal base is mounted between the flow passage forming piece and the control circuit board.

12. The power converter according to claim 4, further comprising:
a control circuit board to generate control signals for controlling the semiconductor chip; and
a metal base to hold the control circuit board,
wherein the metal base is mounted between the flow passage forming piece and the control circuit board.

13. A power converter comprising:
a power module including a semiconductor chip, a sheet conductor coupled to a main surface of the semiconductor chip, a coupling terminal electrically coupled to a direct current power source, and a resin material to seal the sheet conductor; and
a flow passage forming piece including a flow passage for flow of a cooling medium;
a cooler with a bottom including an open section, and also containing a first cooling surface, and a second cooling surface opposite the applicable first cooling surface; and
a condenser cell, and a condenser module including a condenser case to store the applicable condenser cell,
wherein the flow passage forming piece includes an open section coupling with the flow passage on the specified surface,
wherein the power module is immersed into the flow passage from the open section,
wherein the resin material includes a protruding section protruding from the open section,
wherein the coupling terminal is clamped to the protruding section,
wherein a portion of the sheet conductor is coupled to the coupling terminal by way of a metal material that melts at a specified temperature,
wherein the cooler stores the power module,
wherein the sheet conductor includes a first sheet conductor mounted opposite one of the main surfaces of the semiconductor chip, and a second sheet conductor mounted opposite the other main surface of the semiconductor chip, and further the applicable first sheet conductor is mounted by way of the first insulation member opposite the first cooling surface, and the applicable second sheet conductor is mounted by way of the second insulation member opposite the second cooling surface,
wherein the condenser case includes a flange section where holes are formed,
wherein the coupling terminals of the power module pass through holes in the condenser case, and
wherein the metal material is mounted in a space where the flange section of condenser case and the flange section of cooler are formed opposite each other.

\* \* \* \* \*